United States Patent
Suzuki

(10) Patent No.: US 10,679,828 B2
(45) Date of Patent: Jun. 9, 2020

(54) METHOD OF MEASURING GAS INTRODUCING HOLE PROVIDED IN ELECTRODE FOR PLASMA ETCHING DEVICE, ELECTRODE, ELECTRODE REGENERATION METHOD, REGENERATED ELECTRODE, PLASMA ETCHING DEVICE, AND GAS INTRODUCING HOLE STATE DISTRIBUTION DIAGRAM AND DISPLAY METHOD FOR SAME

(71) Applicant: A-SAT CORPORATION, Tokyo (JP)

(72) Inventor: Takayuki Suzuki, Tokyo (JP)

(73) Assignee: A-SAT CORPORATION, Tokyo (JP)

( * ) Notice: Subject to any disclaimer, the term of this patent is extended or adjusted under 35 U.S.C. 154(b) by 632 days.

(21) Appl. No.: 15/319,275

(22) PCT Filed: Dec. 25, 2015

(86) PCT No.: PCT/JP2015/086349
§ 371 (c)(1),
(2) Date: Dec. 15, 2016

(87) PCT Pub. No.: WO2016/104754
PCT Pub. Date: Jun. 30, 2016

(65) Prior Publication Data
US 2017/0148612 A1   May 25, 2017

(30) Foreign Application Priority Data

Dec. 26, 2014  (JP) .................................. 2014-266571
Dec. 26, 2014  (JP) .................................. 2014-266572
(Continued)

(51) Int. Cl.
*H01L 21/20*   (2006.01)
*H01J 37/32*   (2006.01)
(Continued)

(52) U.S. Cl.
CPC .. *H01J 37/32541* (2013.01); *C23C 16/45565* (2013.01); *G01B 11/12* (2013.01);
(Continued)

(58) Field of Classification Search
CPC . G01B 11/12; C23C 16/45565; G01N 21/954
See application file for complete search history.

(56) References Cited

U.S. PATENT DOCUMENTS 5,909,284 A * 6/1999 Nakamura ............. G01B 11/12
356/635
2001/0015175 A1   8/2001 Masuda et al.
(Continued)

FOREIGN PATENT DOCUMENTS

CN   1638026 A   7/2005
CN   101174554 A2   5/2008
(Continued)

OTHER PUBLICATIONS

English translation of CN102522306A.
(Continued)

*Primary Examiner* — Matthew J Song
(74) *Attorney, Agent, or Firm* — Ladas & Parry LLP

(57) ABSTRACT

A method of measuring with which it is possible to measure with a high accuracy a gas introducing hole provided in an electrode for a plasma etching device, and to provide an electrode provided with a highly-accurate gas introducing hole is described. This method is provided to penetrate through in the thickness direction of a base material of the electrode for the plasma etching device, provided with: a step of radiating light toward the gas introducing hole from one surface side of the substrate; a step of acquiring a two-dimensional image of light which has passed through the gas introducing hole to the other surface side of the substrate; and a step of measuring at least one of the
(Continued)

diameter, the inner wall surface roughness, and the degree of verticality of the gas introducing hole, on the basis of the two dimensional image.

8 Claims, 19 Drawing Sheets

(30) Foreign Application Priority Data

Dec. 26, 2014 (JP) ................................. 2014-266573
Dec. 26, 2014 (JP) ................................. 2014-266574
Dec. 26, 2014 (JP) ................................. 2014-266575

(51) Int. Cl.
*H05H 1/46* (2006.01)
*H01L 21/3065* (2006.01)
*G01B 11/12* (2006.01)
*C23C 16/455* (2006.01)
*G01N 21/954* (2006.01)
*H01L 21/67* (2006.01)

(52) U.S. Cl.
CPC ...... *G01N 21/954* (2013.01); *H01J 37/32082* (2013.01); *H01J 37/3288* (2013.01); *H01J 37/3299* (2013.01); *H01J 37/32449* (2013.01); *H01J 37/32532* (2013.01); *H01J 37/32853* (2013.01); *H01J 37/32926* (2013.01); *H01J 37/32935* (2013.01); *H01J 37/32972* (2013.01); *H01L 21/3065* (2013.01); *H01L 21/67069* (2013.01); *H05H 1/46* (2013.01); *H01J 2237/2449* (2013.01); *H01J 2237/334* (2013.01)

(56) References Cited

U.S. PATENT DOCUMENTS

| 2005/0103440 A1* | 5/2005 | Sato ................. H01J 37/32623 156/345.29 |
| 2005/0145170 A1 | 7/2005 | Matsubara et al. |
| 2008/0283086 A1 | 11/2008 | Matsubara et al. |
| 2009/0120582 A1 | 5/2009 | Koshimizu et al. |

FOREIGN PATENT DOCUMENTS

| CN | 102522306 A | 6/2012 |
| EP | 1553208 A2 | 7/2005 |
| JP | 10-298787 A | 11/1998 |
| JP | 11-281307 A | 10/1999 |
| JP | 2005-197467 A | 7/2005 |
| JP | 2010-272645 A | 12/2010 |
| JP | 2010-287757 A | 12/2010 |
| JP | 2011-49567 A | 3/2011 |
| JP | 2011100882 | 5/2011 |
| TW | 201222661 | 6/2012 |
| TW | 201222966 | 6/2012 |
| TW | 201320448 | 5/2013 |

OTHER PUBLICATIONS

English translation of TW201222661.
English translation of TW201222966.
English translation of TW201320448.
JP 11-281307 A English Abstract.
JP 10-298787 A English Abstract.
JP 2011-49567 A English Abstract.
JP 2005-197467 A English Abstract.
CN 1638026 A English Abstract.
CN 101174554 A 2 English Abstract.
JP 2010-272645 A English Abstract.
JP 2010-287757 A English Abstract.
Search Report of European Patent Application No. 15873322.0.

* cited by examiner (a)

(b)

(a)

(b)

(a)

| coordinate | Pore diameter | inner wall surface roughness | determination | Display mode |
|---|---|---|---|---|
| x1,y1 | 455 | 10 | good | ☐ |
| x2,y1 | 480 | 12 | good | ☐ |
| x3,y1 | 465 | 13 | good | ☐ |
| x4,y1 | 494 | 20 | normal | ▨ |
| x5,y1 | 498 | 25 | poor | ▣ |
| ⋮ | | | | |
| xn,yn | 512 | 34 | poor | ▣ |

(b)

(a)

(b)

(a)

(b)

METHOD OF MEASURING GAS INTRODUCING HOLE PROVIDED IN ELECTRODE FOR PLASMA ETCHING DEVICE, ELECTRODE, ELECTRODE REGENERATION METHOD, REGENERATED ELECTRODE, PLASMA ETCHING DEVICE, AND GAS INTRODUCING HOLE STATE DISTRIBUTION DIAGRAM AND DISPLAY METHOD FOR SAME

CROSS-REFERENCE TO RELATED APPLICATION

This U.S. application claims priority under 35 U.S.C 371 to, and is a U.S. National Phase application of, the International Patent Application No PCT/JP2015/086349, filed 25 Dec. 2015; which claims priority from Japanese Applications Nos: 2014-266571 filed 26 Dec. 2014; 2014-266572 filed 26 Dec. 2014; 2014-266573 26 Dec. 2014; 2014-266574 filed 26 Dec. 2014; and 2014-266575 filed 26 Dec. 2014, the disclosures of which are incorporated in their entirety by reference herein.

TECHNICAL FIELD

The present disclosure relates to a measuring method of a gas introduction hole provided in an electrode for a plasma etching device, an electrode, an electrode regeneration method, a regenerated electrode, a plasma etching device, a state distribution diagram of gas introduction holes and a displaying method thereof.

BACKGROUND

A plasma etching device is a device for etching an object such as a semiconductor wafer by generating plasma in a vacuum chamber. A placing table for placing the object, and an upper electrode arranged opposite to the placing table are provided inside the vacuum chamber. A lower electrode is provided in the placing table. Further, a hole (a gas introduction hole) for introducing gas into the vacuum chamber is provided in the upper electrode. During treating the object, gas is introduced into the vacuum chamber from the hole, and the object is etched by applying a high-frequency voltage between the lower electrode and the upper electrode to generate plasma.

The etching fine processing of a semiconductor element by using low temperature plasma in this device is also referred to as dry etching. The dry etching is a process for a semiconductor element. The dry etching is a process for providing a pattern of grooves or holes to a silicon/insulating material film (for example, $SiO_2$, PSG, BPSG)/a metal film (for example, Al, W, Cu) etc., with plasma of reactive gas by using a photoresist pattern as a mask, wherein the photoresist pattern is on a film to be etched which has been cured after photolithography. Thus, the fine processing is performed accurately in accordance with the pattern formed by a lithographic equipment.

Etching gas is introduced into a vacuum chamber in accordance with the film to be etched, and plasma is generated by applying a high-frequency to perform the dry etching. The dry etching is performed through a step of reactive ion etching (RIE: Reactive Ion Etching), in which a region not covered with a resist (mask material) is cut by ion collision.

The ion generated by plasma discharge is subjected to a surface chemical reaction with the film to be etched on a silicon wafer, and the dry etching is conducted by vacuum evacuating the product. After this process, the organic matter of the resist is burned by ashing process. In the case where the dimension of the fine pattern is close to the thickness of the film to be etched, RIE is employed.

This dry etching is the mainstream in the formation of semiconductor element currently. Especially, in the ultra-fine processing of a semiconductor element using a silicon wafer with a size of 300 mm (millimeter), the degree of integration is increased, and the pitch of the line width (Line) and the line space (Space) becomes severe. Therefore, an improvement in the processing characteristics, the yield, and the productivity of the dry etching is further required.

The design rule of the CMOS semiconductor element tends to advance the gate length from 14 nm (nanometer) to 9 nm, and to make the line width and the line space of the etching severe similarly. In the manufacture of such semiconductor element, not only the dimensional accuracy of the pattern, but also the corrosion of the pattern, the dust emission, the damage due charge-up, the change with time and the like, are problems which should be overcome. Furthermore, a technique is desired for controlling the generated plasma by introducing reaction gas which is applicable to a larger diameter of the wafer.

The processing accuracy, the pattern shape, the etching selection ratio, the processing uniformity in the wafer surface, the etching rate and the like are important factors in the dry etching. For example, in order to make the processing cross-sectional surface of the pattern formed by dry etching vertical, a deposition film which is referred to as a side wall protection film should not be too thick. Further, when there is a film thickness variation in the side wall protection film, it will be the cause of the dimension variation. Therefore, techniques such as an ideal low-temperature etching which does not require a side wall protection film are important. Moreover, formation of insufficient side wall protection film at the bottom portion of the pattern, particles migrating on the surface, temperature of the surface, gas flowing at the bottom portion and the like should also be considered.

Further, with respect to the etching uniformity, the flowing of the reaction gas, the uniformities of various conditions such as the plasma uniformity, the bias uniformity, the temperature uniformity, the uniformity of reaction product redeposition and the like are important. Especially, with respect to the wafer of large diameter (for example, size of 300 mm), the non-uniformity of reaction product redeposition has a large effect for the uniformity of the etching processing.

In order to reduce the cost of plasma etching device or etching treatment, the running cost reduction and the like is required, wherein the running cost reduction is resulted from an efficient plasma treatment, a consecutive treatment, and life elongation of components. How to realize the processing defective reduction, the seasoning time reduction, the high operation rate (low failure rate), the maintenance frequency reduction etc., is a problem for obtaining an efficient plasma treatment technique or a high throughput, Especially, the upper electrode of the plasma etching device is a component which is consumed together with etching treatment. Accordingly, a technique of nondestructively monitoring the state of the upper electrode which varies together with the etching treatment, the state of the gas introduction hole, the state of the electrode when not being used, and the state before and after use, is very important for solving various problems of the dry etching.

Here, to manufacture an upper electrode in the plasma etching device, for example, a gas introduction hole is formed in a silicon monocrystal disk by a drilling processing with a diamond drill. In patent document 1, a cleaning method is disclosed. The cleaning method applies a surface treatment to the configuration component (for example, a shower head portion having gas injection holes, or an upper electrode) of the treatment device by using etching solution. In this technique, such as burrs generated during drilling processing are removed, and the surface of the configuration component is flattened.

The inner diameter of the gas introduction hole provided in this upper electrode is about 200 μm (micrometer) to 500 μm, which is very small. In addition, since it is necessary to go through the plate thickness, the length of the gas introduction hole is often greater than 10 mm. When such gas introduction hole is not accurately formed, the gas required by plasma etching cannot be uniformly introduced into the chamber, and the treatment of the object is likely to become uneven in the surface. In recent years, object such as a wafer has increased in size, and forming a number of gas introduction holes with high accuracy has become very important.

Here, it is very difficult to measure the state of the elongated gas introduction hole provided in the upper electrode nondestructively. For this reason, the lifetime of the upper electrode is not managed by the state of gas introduction hole, but is managed according to the using time. In other words, the relationship between the using time and the particle generation amount of the upper electrode is obtained as data in advance. According to the data, when the using time has become the time at which the particle generation amount exceeds the allowable range, it is determined that the lifetime of the upper electrode has ended.

PRIOR ART REFERENCE

Patent Document

[Patent document 1] publication number 2003-68653 in Official Gazette

SUMMARY

Problems to be Solved by the Disclosure

Among the film to be etched in the dry etching, Si, poly-Si, $Si_3N_4$, $SiO_2$, Al, W, cu, $Ta_2O_5$, TiN, etc., can be enumerated. As for the reaction etching gas, compound gas of halogen element such as $CF_4$, $SF_6$, $CL_2$, Hbr, $CHF_3$, $CH_2F_2$, $H_2$, $C_2F_6$, $C_4F_6$, $BCL_3$, etc., are mainly used. The films to be etched according to the plasma etching device are roughly divided into three types, which are used for Si and poly-Si film, for insulating film, and for metal film, respectively. According to the types of the films to be etched, there is no large difference in the configuration elements of the plasma etching devices. When the etching gas is different, the inner material of the etching chamber and the method for detecting the end point of the etching are optimally set depending on the material to be etched.

In RIE, it is necessary to generate a high-density plasma stably, so as to uniformly generating ions in a large area such as a silicon wafer with a size of 300 mm. Therefore, when the reaction product adheres to the upper electrode, it becomes impossible to provide a uniform ion shower in the wafer surface, and dust is also likely to occur to such an extent that an off-specification etching is resulted.

Initially, the dry etching device adopted a type in which a parallel-plate structure including upper/lower electrodes is used to flow and discharge the etching gas between the electrodes. Currently, the RIE device in which the upper electrode is provided with through holes, and the low vapor pressure etching gas is ejected in a shower-like form, is used.

In this RIE device, a wafer susceptor is disposed on the lower electrode in the process chamber for the etching. An etching gas supply system and a vacuum (about 0.1 Pa) system are connected to this process chamber. A temperature adjusting system of the susceptor and a high-frequency power source are provided to the lower electrode.

Furthermore, a front chamber of load lock is included so as to sustain vacuum in the process chamber constantly. In order to improve the productivity and the reliability, silicon wafer is transported under vacuum to the etching chamber. This transport mechanism is referred to as load lock mechanism. In the etching device where the silicon wafer is treated in a type of single wafer, a cassette box usually capable of storing 25 pieces of silicon wafers is used, and this cassette box is transported with a robot. Thus, the silicon wafer is automatically transported by set-to-cassette.

For the ultra-fine processing in which the line width is below 1 μm, in plasma generation, it is necessary to reduce the conventional gas pressure of 1 Torr to several hundred mTorr, and improve the direction of the ions colliding with the silicon wafer surface, as well as increase the plasma density to obtain a throughput improvement For this purpose, a nondestructive prehension of the through hole inner surface roughness and the like of silicon upper electrode having through holes of about 0.5 μm is important.

The processing dimension (CD: Critical Dimension) of the pattern is dependent on the non-uniformity of radicals, ions, and the producing substance of the dry etching which is a complicated reaction. The homogeneity of etching gas introduced from the through holes of the silicon upper electrode, the discharge of the reaction product, and the lower silicon electrode temperature in the entire silicon wafer surface is required.

However, it is very difficult to measure the state of the elongated gas introduction hole provided in the upper electrode nondestructively. Here, although a measurement by X-ray image is considered as a nondestructive measurement, since a number of gas introduction holes are provided in the upper electrode, such a problem that images of other holes are duplicated in the image of the gas introduction hole to be measured, and a highly accurate measurement cannot be conducted, will occur when an X-ray image has been obtained in a direction perpendicular to the length direction of the holes.

Also, there is a problem that the upper electrode must be replaced with a new one when the lifetime is determined to have reached the end according to the time management, in spite of still being capable of using actually.

In addition, it is difficult to measure the state of the gas introduction hole of the upper electrode in a state of being mounted in the plasma etching device.

Further, as described above, since it is difficult to measure the state of the gas introduction hole provided in the upper electrode nondestructively, a technique capable of easily grasping the state of the gas introduction hole provided in the upper electrode has not disclosed yet. For this reason, the management of the upper electrode must be a management by the using time.

One object of the present disclosure is to provide a measuring method which can measure a gas introduction hole provided in an electrode for a plasma etching device with high accuracy, and to provide an electrode having a highly accurate gas introduction hole.

Further, another object of the present disclosure is to provide a method capable of regenerating a used electrode among electrodes for a plasma etching device.

Further, another object of the present disclosure is to provide a regenerated electrode obtained by regenerating a used electrode among electrodes for a plasma etching device.

Further, another object of the present disclosure is to provide a plasma etching device capable of measuring a gas introduction hole provided in an upper electrode for the plasma etching device with high accuracy.

Further, another object of the present disclosure is to provide a distribution diagram capable of easily grasping the state of a gas introduction hole provided in an electrode for a plasma etching device, and to provide a displaying method of the same.

Means for Solving the Problems

In order to solve the above problems, the measuring method of the gas introduction hole provided in the electrode for the plasma etching device according to the present disclosure is a method for measuring the gas introduction hole provided so as to penetrate the substrate of the electrode for the plasma etching device in the thickness direction, including: a step of irradiating light from one surface side of the substrate toward the gas introduction hole, a step of obtaining a two-dimensional image of the light transmitted to the other surface side of the substrate via the gas introduction hole; and, a step of measuring at least one of a diameter, an inner wall surface roughness and a degree of perpendicularity of the gas introduction hole based on the two-dimensional image.

According to such configuration, by using the relationship between the two-dimensional image of the light transmitted through the elongated gas introduction hole and the state of the gas introduction hole, at least one of the diameter, the inner wall surface roughness and the degree of perpendicularity of the gas introduction hole can be measured nondestructively.

The light may be coherent light in the measuring method of the gas introduction hole of the present disclosure. Further, the inner wall surface roughness of the gas introduction hole may be measured based on the slope of the signal along the scanning line of the two-dimensional image.

The measuring method of the gas introduction hole of the present disclosure, further includes a step of obtaining an opening portion image of the gas introduction hole from one surface side of the substrate. In the step of measuring the gas introduction hole, the measurement may be performed based on the two-dimensional image and the opening portion image. According to such configuration, a more accurate measurement can be performed from the relationship of two images of the two-dimensional image and the opening portion image.

The electrode of the present disclosure is an electrode used in the plasma etching device, including a plate-like substrate provided with a plurality of gas introduction holes penetrating in the thickness direction, wherein the diameter of the plurality of gas introduction holes has been measured. Further, the electrode of the present disclosure is characterized in that, at least one of the diameter, the inner wall surface roughness and the degree of perpendicularity of the plurality of gas introduction holes is formed so as to be within a previously set range in the case of being measured by the above mentioned measuring method. According to such configuration, an electrode having a highly accurate gas introduction hole can be provided.

The electrode of the present disclosure is characterized in that, a plurality of gas introduction holes are provided in the substrate, and light irradiating from one surface side of the substrate reaches the other surface side of the substrate via the plurality of gas introduction holes. Further, in the electrode of the present disclosure, variation in the intensity of light transmitted through the plurality of gas introduction holes may be no more than a previously set fixed value.

The regeneration method of the electrode for the plasma etching device of the present disclosure is a regeneration method of the electrode for the plasma etching device provided with a gas introduction hole penetrating the substrate in thickness direction, including: a step of measuring a state of the gas introduction hole of the electrode has been used a predetermined time; a step of performing one of a polishing of the surface of the substrate and a processing of the inner wall surface of the gas introduction hole based on the measurement result of the state of the gas introduction hole.

According to such configuration, the regeneration of the electrode can be performed based on the measurement result of the state of the gas introduction hole. That is, the regeneration can be performed by processing the surface of the substrate or the inner wall surface of the gas introduction hole, even it is determined that the electrode has reached the lifetime by the time management.

In the regeneration method of the present disclosure, the step of measuring the state of the gas introduction hole may include: a step of irradiating light from one surface side of the substrate toward the gas introduction hole; a step of obtaining a two-dimensional image of the light transmitted to the other surface side of the substrate via the gas introduction hole; and, a step of measuring at least one of the diameter, the inner wall face roughness and the degree of perpendicularity of the gas introduction hole based on the two-dimensional image.

According to such configuration, by using the relationship between the two-dimensional image of the light transmitted through the elongated gas introduction hole and the state of the gas introduction hole, at least one of the diameter, the inner wall surface roughness and the degree of perpendicularity of the gas introduction hole can be measured nondestructively.

The light may be coherent light in the regenerating method of the present disclosure. Further, the inner wall surface roughness of the gas introduction hole may be measured based on the slope of the signal along the scanning line of the two-dimensional image.

The measuring method of the gas introduction hole of the present disclosure, further includes a step of obtaining an opening portion image of the gas introduction hole from one surface side of the substrate. In the step of measuring the gas introduction hole, the measurement may be performed based on the two-dimensional image and the opening portion image. According to such configuration, a more accurate measurement can be performed from the relationship of two images of the two-dimensional image and the opening portion image.

In the regenerating method of the present disclosure, a polishing of the surface of the substrate may be performed in the case where in the measurement result of the state of the gas introduction hole, the inner wall surface roughness of the gas introduction hole is within a previously set range; and a processing of the inner wall surface of the gas introduction hole may be performed in the case where in the measurement result of the state of the gas introduction hole, the inner wall surface roughness of the gas introduction hole is not within the range. According to such configuration, the electrode can be regenerated by an optimum processing method in accordance with the state of the gas introduction hole.

In the regenerating method of the present disclosure, the processing of the inner wall surface of the gas introduction hole may include at least one of a perforation processing for increasing the diameter of the gas introduction hole and an etching processing of the inner wall surface of the gas introduction hole. By performing the perforation processing for increasing the diameter of the gas introduction hole, the gas introduction hole can be regenerated based on the original gas introduction hole. Further, by performing the etching processing of the inner wall surface of the gas introduction hole, the gas introduction hole can be regenerated without changing the diameter of the gas introduction hole.

In the regenerating method of the present disclosure, the processing of the inner wall surface of the gas introduction hole may include performing the etching processing of the inner wall surface of the gas introduction hole, after performing the perforation processing for increasing the diameter of the gas introduction hole. By such configuration, a gas introduction hole having a smooth inner wall surface can be obtained by regeneration via removing burrs of the inner surface generating in the perforation processing for increasing the diameter of the gas introduction hole.

In the regenerating method of the present disclosure, the main material of the substrate may be any of silicon, quartz and silicon carbide. By the regenerating method of the present disclosure, the electrode of these main materials can be regenerated.

The regenerated electrode for the plasma etching device of the present disclosure, is provided with a gas introduction hole penetrating in the thickness direction of the substrate. The state of the gas introduction hole of the electrode before regeneration is measured, at least one of the polishing of the surface of the substrate and the processing of the inner wall surface of the gas introduction hole is performed based on the measurement result of the gas introduction hole, and the state of the processed gas introduction hole is measured.

According to such configuration, an electrode regenerated based on the measurement result of the state of the gas introduction hole is provided. That is, even the electrode is determined to have reached the lifetime by the time management, a regenerated electrode can be provided by processing the surface of the substrate or the inner wall surface of the gas introduction hole.

In the regenerated electrode of the present disclosure, the measurement of the state of the gas introduction hole may include: irradiating light from one surface side of the substrate toward the gas introduction hole; obtaining a two-dimensional image of the light transmitted to the other surface side of the substrate via the gas introduction hole; and, measuring at least one of the diameter, the inner wall face roughness and the degree of perpendicularity of the gas introduction hole based on the two-dimensional image.

According to such configuration, by using the relationship between the two-dimensional image of the light transmitted through the elongated gas introduction hole and the state of the gas introduction hole, at least one of the diameter, the inner wall surface roughness and the degree of perpendicularity of the gas introduction hole can be measured nondestructively.

In the regenerated electrode of the present disclosure, the light used in the measurement of the state of the gas introduction hole may be coherent light. Further, the inner wall surface roughness of the gas introduction hole may be measured based on the slope of the signal along the scanning line of the two-dimensional image.

In the regenerated electrode of the present disclosure, the measurement of the state of the gas introduction hole further includes obtaining an opening portion image of the gas introduction hole from one surface side of the above-mentioned substrate. When measuring the gas introduction hole, the measurement may be performed based on the two-dimensional image and the opening portion image. According to such configuration, a more accurate measurement can be performed from the relationship of two images of the two-dimensional image and the opening portion image.

In the regenerated electrode of the present disclosure, a polishing of the surface of the substrate may be performed in the case where in the measurement result of the state of the gas introduction hole, the inner wall surface roughness of the gas introduction hole is within a previously set range; and a processing of the inner wall surface of the gas introduction hole may be performed in the case where in the measurement result of the state of the gas introduction hole, the inner wall surface roughness of the gas introduction hole is not within the range. According to such configuration, an electrode regenerated by an optimum processing method in accordance with the state of the gas introduction hole can be provided.

In the regenerated electrode of the present disclosure, the processing of the inner wall surface of the gas introduction hole may include at least one of a perforation processing for increasing the diameter of the gas introduction hole and an etching processing of the inner wall surface of the gas introduction hole. By performing the perforation processing for increasing the diameter of the gas introduction hole, the gas introduction hole can be regenerated based on the original gas introduction hole. Further, by performing the etching processing of the inner wall surface of the gas introduction hole, the gas introduction hole can be regenerated without changing the diameter of the gas introduction hole.

In the regenerated electrode of the present disclosure, the processing of the inner wall surface of the gas introduction hole may include performing the etching processing of the inner wall surface of the gas introduction hole, after performing the perforation processing for increasing the diameter of the gas introduction hole. By such configuration, a gas introduction hole having a smooth inner wall surface can be obtained by regeneration via removing burrs of the inner surface generating in the perforation processing for increasing the diameter of the gas introduction hole.

In the regenerated electrode of the present disclosure, the main material of the substrate may be any of silicon, quartz and silicon carbide. A regenerated electrode obtained from these main materials is provided by the present disclosure.

The plasma etching device of the present disclosure includes: a chamber; an upper electrode provided in the chamber, having a gas introduction hole penetrating in the thickness direction of the substrate; a lower electrode opposite to the upper electrode, being provided in the chamber; a high-frequency applying part for applying a high-frequency between the upper electrode and the lower electrode in the chamber; and a measuring part for measuring the state of the gas introduction hole. The measuring part includes: a light-emitting part for irradiating light from one surface side of the substrate toward the gas introduction hole; a light receiving part for obtaining a two-dimensional image of the light transmitted to other surface of the substrate via the gas introduction hole; and an image processing part for measuring at least one of a diameter, an inner wall surface roughness and a degree of perpendicularity of the gas introduction hole based on the two-dimensional image.

According to such configuration, by using the relationship between the two-dimensional image of the light transmitted through the elongated gas introduction hole provided in the upper electrode and the state of the gas introduction hole, at least one of the diameter, the inner wall surface roughness and the degree of perpendicularity of the gas introduction hole can be measured nondestructively. In addition, the measurement of the gas introduction hole can be performed in a state where the upper electrode is mounted in the plasma etching device.

In the plasma etching device of the present disclosure, the light used in the measurement of the gas introduction hole may be coherent light. Further, the inner wall surface roughness of the gas introduction hole may be measured based on the slope of the signal along the scanning line of the two-dimensional image.

The plasma etching device of the present disclosure further includes an opening portion image for obtaining an opening portion image of the gas introduction hole from one surface side of the substrate. In the step of measuring the gas introduction hole, the measurement may be performed based on the two-dimensional image and the opening portion image obtained by the image obtaining part. According to such configuration, a more accurate measurement can be performed from the relationship of two images of the two-dimensional image and the opening portion image.

In the plasma etching device of the present disclosure, the light-emitting part may be provided movably in the holding part for holding the upper electrode. Further, the light receiving part may be provided movably forward and backward between the upper electrode and the lower electrode. According to such configuration, the measurement of the gas introduction hole can be performed in a state where the upper electrode is mounted in the plasma etching device.

The plasma etching device of the present disclosure includes: a chamber; an upper electrode provided in the chamber, having a gas introduction hole penetrating in the thickness direction of the substrate; a lower electrode opposite to the upper electrode, being provided in the chamber; and a high-frequency applying part for applying a high-frequency between the upper electrode and the lower electrode in the chamber. The upper electrode is characterized in that, a plurality of gas introduction holes are provided in the substrate, and light irradiating from one surface side of the substrate reaches the other surface side of the substrate via the plurality of gas introduction holes. In the plasma etching device of the present disclosure, variation in the intensity of light transmitted through the plurality of gas introduction holes may be no more than a previously set fixed value.

In order to solve the above problems, the state distribution diagram of the gas introduction holes provided in the electrode for the plasma etching device of the present disclosure, is a distribution diagram for showing the state of the plurality of gas introduction holes provided to penetrate a substrate of the electrode for the plasma etching device in the thickness direction, displaying the state of each of the plurality of gas introduction holes in a display mode corresponding to the state, in response to the position of the plurality of gas introduction holes in the surface of the substrate. According to such configuration, the distribution of the state of the plurality of gas introduction holes in the surface of the substrate is displayed visually and clearly.

In the state distribution diagram of the present disclosure, the display mode may be at least one of color, pattern and height. Thereby, the distribution of the plurality of gas introduction holes in the surface of the substrate is represented by at least one display mode of color, pattern and height.

In the state distribution diagram of the present disclosure, the state of the gas introduction hole may be a result obtained by: irradiating light from one surface side of the substrate toward the gas introduction hole; obtaining the two-dimensional image of the light transmitted to the other surface side of the substrate via the gas introduction hole; and, measuring at least one of the diameter, the inner wall face roughness and the degree of perpendicularity of the gas introduction hole based on the two-dimensional image.

According to such configuration, by using the relationship between the two-dimensional image of the light transmitted through the elongated gas introduction hole and the state of the gas introduction hole, an objective state distribution in the surface wherein at least one of the diameter, the inner wall surface roughness and the degree of perpendicularity of the gas introduction hole has been measured nondestructively, can be obtained.

The displaying method of the state distribution diagram of the present disclosure is a display method for displaying the distribution diagram in a displaying part, wherein the distribution diagram represents the state of the plurality of gas introduction holes provided to penetrate the substrate of the electrode of the plasma etching device in the thickness direction. The displaying method includes: a step of reading the measurement result of the state of each of the plurality of gas introduction holes in the calculating part; displaying the state of each of the plurality of gas introduction holes in correspondence to positions of the plurality of gas introduction holes in the substrate based on the measurement result in a display mode corresponding to the state. According to such configuration, the state distribution of the plurality of gas introduction holes in the surface of the substrate can be displayed in the displaying part, and the state distribution diagram can be displayed visually and clearly.

In the displaying method of the state distribution diagram of the present disclosure, the measurement of the state of the gas introduction hole may include: irradiating light from one surface side of the substrate toward the gas introduction hole; obtaining a two-dimensional image of the light transmitted to the other surface side of the substrate via the gas introduction hole; and, measuring at least one of the diameter, the inner wall face roughness and the degree of perpendicularity of the gas introduction hole based on the two-dimensional image.

According to such configuration, by using the relationship between the two-dimensional image of the light transmitted through the elongated gas introduction hole and the state of the gas introduction hole, at least one of the diameter, the inner wall surface roughness and the degree of perpendicularity of the gas introduction hole can be measured nondestructively, and an objective state distribution in the surface can be displayed.

In the displaying method of the state distribution diagram of the present disclosure, the light used in the measurement of the state of the gas introduction hole may be coherent light. Further, the inner wall surface roughness of the gas introduction hole may be measured based on the slope of the signal along the scanning line of the two-dimensional image.

In the displaying method of the state distribution diagram of the present disclosure, the measurement of the state of the gas introduction hole further includes obtaining an opening portion image of the gas introduction hole from one surface side of the above-mentioned substrate. When measuring the gas introduction hole, the measurement may be performed based on the two-dimensional image and the opening portion image. According to such configuration, a more accurate measurement can be performed, and a more objective state distribution in the surface from the relationship of two images of the two-dimensional image and the opening portion image.

DETAILED DESCRIPTION

Figure 1:
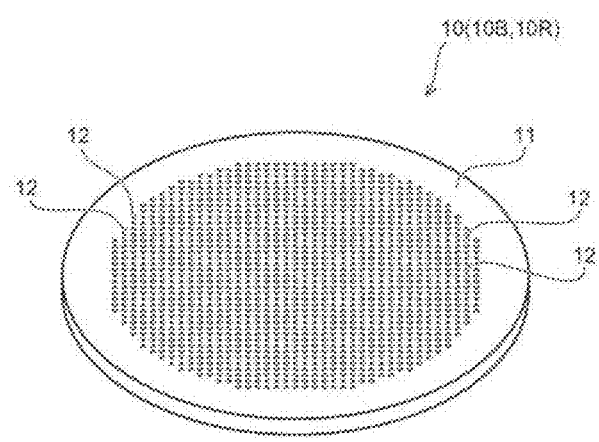
FIGS. 1 (a) and (b) are schematic views illustrating an electrode for a plasma etching device.
Figure 1:
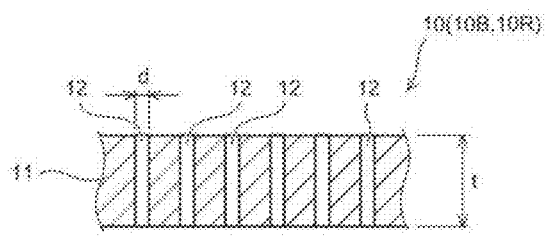

The embodiments of the present disclosure will be described based on the accompanying drawings below. It should be noted that, in the following description, the same members are denoted by the same reference numerals, the member once explained will be omitted as appropriate.
(Electrode for Plasma Etching Device and Regenerated Electrode)

FIGS. 1 (a) and (b) are schematic views illustrating an electrode for a plasma etching device and a regenerated electrode. FIG. 1 (a) represents a perspective view of the electrode, and FIG. 1 (b) represents an enlarged sectional view of a part of the electrode. Incidentally, in the present embodiment, an electrode before being regenerated is used as electrode before regeneration 10B, the electrode before regeneration 10B and the regenerated electrode 10R will be referred to as electrode 10 collectively when not being distinguished.

As shown in FIG. 1 (a), the electrode 10 having a configuration in which a plurality of gas introduction holes 12 are provided in for example a disk-shaped substrate 11.

The plurality of gas introduction holes 12 are provided so as to penetrate in the thickness direction of the substrate 11. The plurality of gas introduction holes 12 are arranged at predetermined intervals in the vertical and horizontal directions of the surface of the substrate 11. The plurality of gas introduction holes 12 may be arranged concentrically to the center of the substrate 11.

The diameter of the substrate 11 is set in accordance with the size of the plasma etching object (wafer etc.). For example, when a wafer with a diameter of about 100 mm (millimeter) is used as the object, the diameter of the electrode 10 is about 150 mm or more and 200 mm or less. When a wafer with a diameter of about 150 mm is used as the object, the diameter of the electrode 10 is about 200 mm or more and 280 mm or less. When a wafer with a diameter of about 200 mm is used as the object, the diameter of the electrode 10 is about 280 mm or more and 320 mm or less. When a wafer with a diameter of about 300 mm is used as the object, the diameter of the electrode 10 is about 320 mm or more and 376 mm or less. When a wafer with a diameter of about 450 mm is used as the object, the diameter of the electrode 10 is about 450 mm or more.

Silicon, quartz, silicon carbide or the like is used as the material of the substrate 11. The substrate 11 may be constituted by two or more materials. For example, the substrate 11 may have a constitution in which a conductive material is coated by an insulating material.

As shown in FIG. 1 (b), the thickness of the substrate 11 is, for example, 5 mm or more and 13 mm or less. The diameter d of the gas introduction hole 12 is, for example, 200 μm or more and 600 μm or less. The ratio of the diameter d of the gas introduction hole 12 to the thickness of the substrate 11 is, for example, 2% or more and 6% or less.

As an example, in the present embodiment, the diameter of the substrate 11 is 376 mm, and the thickness of the substrate 11 is 10 mm, the diameter d of the gas introduction hole 12 is 500 μm, and the number of the gas introduction holes 12 is 912. Thus, by providing many greatly elongated gas introduction holes 12 in electrode 10, the reactive gas necessary for the plasma etching can be introduced uniformly.

The gas introduction hole 12 is formed by performing a drilling processing to the substrate 11. During this drilling processing, burrs are generated on the inner wall of the gas introduction hole 12. In the electrode 10 according the present embodiment, the burrs of the inner wall of the gas introduction hole 12 are removed, and the inner wall surface roughness is suppressed. The state of the gas introduction hole 12 is measured by the measuring method to be described later. Incidentally, in the present embodiment, this measuring method may also be referred to as the present measuring method.

Here, the state of the gas introduction hole 12 is measured quantitatively in the electrode before regeneration 10B and the regenerated electrode 10R, respectively. That is, in the regenerated electrode 10R according to the present embodiment, the state of the gas introduction hole 12 of the electrode before regeneration 10B is measured, and the state of the gas introduction hole 12 of the regenerated electrode 10R is also measured.

The regenerated electrode 10R has been subjected at least one of a polishing of the surface of the substrate 11 and a processing of the inner wall surface of the gas introduction hole 12, based on the measurement result of the state of the gas introduction hole 12 of the electrode before regeneration 10B. By measuring the state of the gas introduction hole 12 before and after regeneration, the change (history) in the state of the gas introduction hole 12 from before regeneration to after regeneration can be objectively managed. By measuring the state of the gas introduction hole 12, the electrode before regeneration 10B becomes the reusable regenerated electrode 10R by processing the surface of the substrate 11 or the inner wall surface of the gas introduction holes 12, even it is determined to have reached the lifetime by time management.

In the present embodiment, both the electrode before regeneration 10B and the regenerated electrode 10R are desired to be measured by the present measuring method.

The electrode 10 according to the present embodiment includes a gas introduction hole 12 as measured by this measuring method. For example, at least one of the diameter, the inner wall surface roughness and the degree of perpendicularity of the plurality of gas introduction holes 12 is within a previously set fixed range, when measured by the measuring method according to the present embodiment.

As an example, the diameters of all (for example, 912) of the gas introduction holes 12 provided in the substrate 11 are measured by the measuring method according to the present embodiment. For example, a standard deviation (σ) is calculated from the measured diameters, and the electrode 10 is constituted wherein such as this σ or 3σ becomes a fixed value or less. The same applies to the inner wall surface roughness or the degree of perpendicularity measured by the measuring method according to the present embodiment.

In the electrode 10 according to the present embodiment having such gas introduction hole 12, through suppressing the variation in the diameter or the degree of perpendicularity, and suppressing the inner wall surface roughness, gas can be introduced smoothly, and the plasma uniformity is improved. Accordingly, it is hard to be damaged during plasma etching, and lifetime extension of the electrode 10 can be achieved.

Further, the diameter of the gas introduction hole 12 provided in the substrate 11 is not necessary to be within the surface of the substrate 11. That is, in order to alter the distribution of gas introduction intentionally, the diameter of the gas introduction hole 12 can be changed depending on the position in the surface of the substrate 11. Because the diameter of the gas introduction hole 12 can be measured by the measuring method according to the present embodiment, the diameter distribution of gas introduction holes 12 in the surface of the substrate 11 can be obtained accurately.

For example, the hole diameter of the peripheral portion is made larger than the hole diameter of center portion in the surface of the substrate 11, or on the contrary, the hole diameter of the peripheral portion is made smaller than the hole diameter of center portion in the surface of the substrate 11. The distribution of gas introduction can be controlled and reflected in the process by setting the diameter of the gas introduction hole 12. By using the measuring method according to the present embodiment, it is possible to provide an electrode 10 in which the diameter of the gas introduction hole 12 can be measured precisely and reflected in the process.

Further, the state of the gas introduction holes 12 provided in the electrode before regeneration 10B is measured by the present measuring method, this measurement result and the measurement result of the regenerated electrode 10R can be compared. In the present measuring method, it is possible to accurately measure the state of the elongated gas introduction hole 12, which is difficult conventionally. By measuring the gas introduction hole 12 with the same measuring method before and after regeneration, the history of regeneration of one electrode 10 can be left. In the case where a serial number is added to the electrode 10, it may be stored in a database of this serial number and the regeneration history. By searching the database with serial number, it can be quickly and accurately grasp the history of the regenerated electrode 10R.

Incidentally, although the state of the gas introduction hole 12 of the electrode 10 has been measured in the present embodiment, an electrical characteristic (for example, resistance value) of the electrode 10 may also be measured. In other words, the resistance value of the electrode before regeneration 10B and the resistance value of the regenerated electrode 10R are measured. Because the resistance value of the electrode 10 changes with using time, diversified management of the characteristics of the regenerated electrode 10R can be conducted by measuring the resistance values before and after regeneration.

(Plasma Etching Device)

Figure 2:
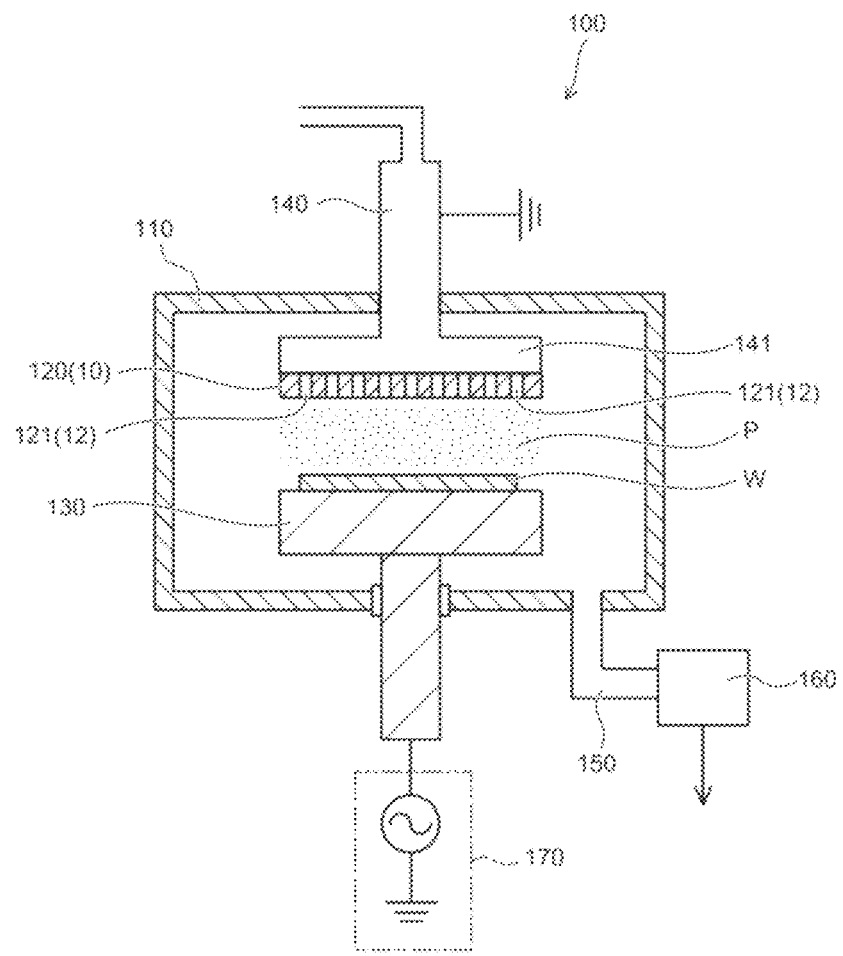
FIG. 2 is a schematic view illustrating the configuration of the plasma etching device.

FIG. 2 is a schematic view illustrating the configuration of the plasma etching device.

As shown in FIG. 2, the plasma etching device 100 includes a chamber 110, an upper electrode 120, a lower electrode 130, a gas introduction passage 140, an exhaust passage 150, a pump 160 and a high-frequency applying part 170. That is, the plasma etching device 100 is a RIE (Reactive Ion Etching) device.

The chamber 110 is maintained in a reduced pressure state by the pump 160. The upper electrode 120 and lower electrode 130 are disposed opposite to each other in the chamber 110. The electrode 10 according to the present embodiment is applied as the upper electrode 120. The upper electrode 120 is attached to the holding part 141 provided on the chamber 110 side of the gas introduction passage 140. The lower electrode 130 is a placing part for placing the object W such as a wafer by electrostatic chuck or the like.

To treat the object W with the plasma etching device 100, the object W is placed on the lower electrode 130, and the inside of chamber 110 is set in a reduced pressure state by the pump 160. Thereafter, the reactive gas is introduced into the chamber 110 from the gas introduction passage 140. The reactive gas is introduced into the chamber 110 through the gas introduction hole 121 (12) of the upper electrode 120 from the gas introduction passage 140. Then, a high-frequency (for example, 13.56 MHz) is applied between the upper electrode 120 and the lower electrode 130 by the high-frequency applying part 170, while introducing the reactive gas. Thus, plasma P is generated in the chamber 110 to perform a treatment such as etching or film forming on the surface of the object W.

In the case of the plasma etching device 100, $CF_4$, $SF_6$, $CHF_3$, $CCl_4$, $SiCl_4$, $Cl_2$, $Br_2$, HBr or the like is used as the reactive gas. The reactive gas is selected appropriately depending on the material of the object W to be etched.

When the electrode 10 according to the present embodiment is used as the upper electrode 120 of the plasma etching device 100, the reactive gas will smoothly pass through the gas introduction hole 121 (12) and be introduced into the chamber 110. Therefore, the reactive gas is introduced between the upper electrode 120 and the lower electrode 130 with high uniformity, and a stable treatment is performed with respect to the object W.

Here, the plasma etching device 100 is possible to perform etching via making for example highly reactive F atoms generated by plasma of $CF_4$ react with Si to form $SiF_4$. Then, an anisotropic etching is preformed by generating a DC bias for accelerating ions to the cathode electrode applied with the high-frequency (RF).

When $H_2$ is added in $CF_4$ as the reactive gas, the etching rate of Si is reduced, and the selection ratio is improved. The etching proceeds while a reaction layer containing intermediate product of the reaction on the surface of Si. A reaction between etching species and the material to be etched is promoted by colliding ions to the surfaced attached with the etching species. As a result of removing this thin film in the bottom surface of the pattern which is collided by ions, an anisotropic processing becomes possible.

In recent years, in order to expand the physical limit of device performance, various new materials (porous low-k, high-k, high sensitive excimer resist, etc.) and new structure (damascene wiring, strained silicon, Fin-type gate, etc.) have appeared one after another. In plasma etching devices and plasma etching techniques, monitoring and feedback are important for corresponding to these.

For example, correlation of external parameters (setting conditions of gas species, pressure, RF power, etc.), internal parameters (plasma density, radical composition/density, ion species/energy, etc.), and etching characteristic (etching rate, shape, etc.) is necessary to be understood scientifically. Further, the enhancement of the fundamental reaction process data is necessary at the same time. This makes it possible to accumulate the reaction data which can be universally utilized regardless of the hardware.

Moreover, under the situation that the realization of a high selection ratio in a thin film or an interlayer of several nm has become even more difficult, the effect of the uniformity improvement is great. In addition, the uniformity also has strong affect in controlling the conversion difference of processing dimension (CD: Critical Dimension) of the pattern.

Furthermore, in the etching of the insulating film used in a semiconductor element, it is believed that the Si—O bond is broken by ions, O is removed by a C—O bond, a relatively weak Si—F bond is allowed, and the etching proceeds. An important condition setting is necessary to be clarified in the etching reaction of such insulating film. To elucidate the etching mechanism, it is necessary to create a variety of monitoring techniques.

(Plasma Etching Device Including Measuring Device)

Figure 3:
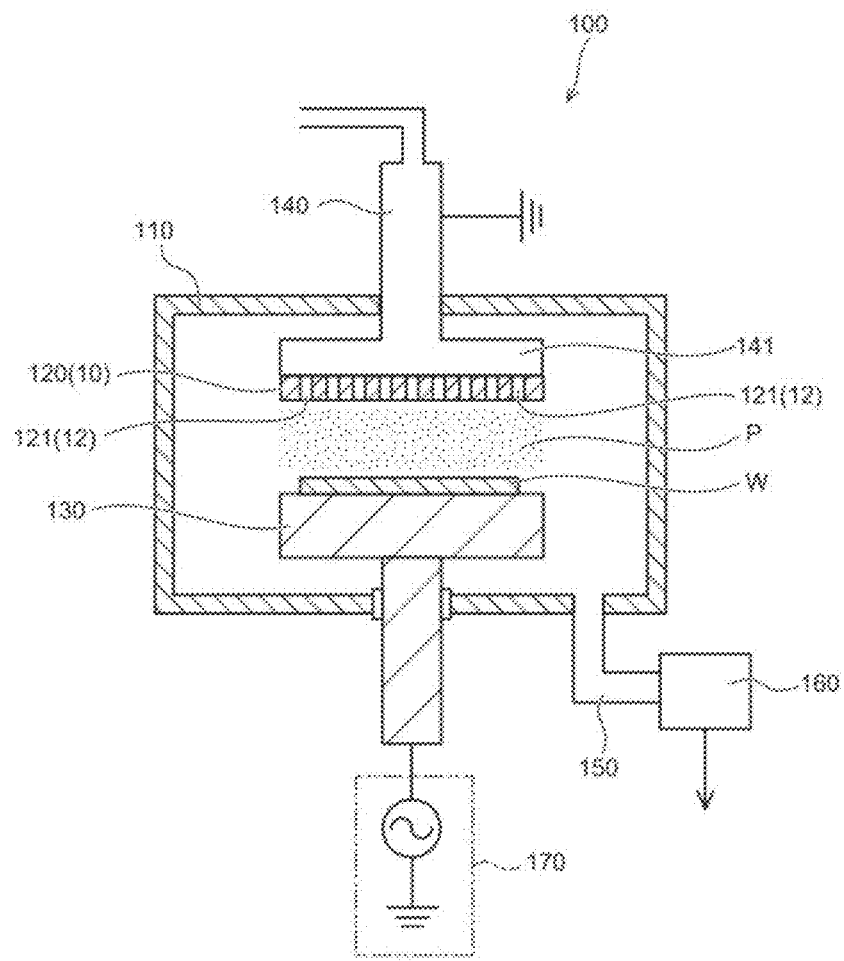
FIG. 3 is a schematic view illustrating the configuration of the plasma etching device including a measuring device.

FIG. 3 is a schematic view illustrating the configuration of the plasma etching device including a measuring device.

As shown in FIG. 3, the plasma etching device 100B includes a chamber 110, an upper electrode 120, a lower electrode 130, a gas introduction passage 140, an exhaust passage 150, a pump 160, a high-frequency applying part 170 and a measuring device 200. The chamber 110, the upper electrode 120, the lower electrode 130, the gas introduction passage 140, the exhaust passage 150, the pump 160 and the high-frequency applying part 170 are the same as those in the plasma etching device 100.

The state of the gas introduction hole 121 (12) of the upper electrode 120 of the plasma etching device 100 is measured by the measuring device 200. The measuring device 200 includes a light-emitting part 210, a light receiving part 220, and an image processing part 225.

The light-emitting part 210 irradiates light L1 from one surface side of the substrate 11 toward the gas introduction hole 121 (12). The light-emitting part 210 is provided in, for example a holding part 141 for holding the upper electrode 120. The light-emitting part 210 may be provided movably.

The light receiving part 220 obtains the two-dimensional image of the light L2 transmitted to the other surface side of the substrate 11 via the gas introduction hole 121 (12). The light receiving part 220 may be provided movably forward and backward between the upper electrode 120 and the lower electrode 130. The light receiving part 220 may be adapted to move in conjunction with the light-emitting part 210.

The image processing part 225 performed the processing for measuring at least one of the diameters, the inner wall surface roughness and the degree of perpendicularity based on the two-dimensional image.

In the plasma etching device 100 according to the present embodiment, the state of the gas introduction hole 121 (12) can be measured by the measuring device 200 while the upper electrode 120 is mounted. The state of the gas introduction hole 121 (12) is measured with the present measuring method to be described later, by using this measuring device 200.

When using the upper electrode 120 having the gas introduction hole 121 (12) measured by the present measuring method, the reactive gas will smoothly pass through the gas introduction hole 12 and be introduced into the chamber 110. Therefore, the reactive gas is introduced between the upper electrode 120 and the lower electrode 130 with high uniformity, and a stable treatment is performed with respect to the object W.

Further, in the plasma etching device 100 according to the present embodiment, the state of the gas introduction hole 121 (12) can be measured by the measuring device 200 at the timing when the previously set etching treatment time has passed. The measurement by the measuring device 200 can be performed without detaching the upper electrode 120 from the holding part 141.

If the measurement result is within the specification when comparing at least one of the diameter, the inner wall surface roughness, and the degree of perpendicularity of the gas introduction hole 121 (12) with a criterion, the upper electrode 120 is determined that it can be used as it is. On the other hand, it is determined to be the time of replacing the upper electrode 120 if beyond the specification.

Thus, since the state of the gas introduction hole 121 (12) can be measured when the upper electrode 120 is attached to the holding part 141, the upper electrode 120 is unnecessary to be detached for the measurement, at the same time, the measurement is possible to be performed without touching the upper electrode 120 or generating contamination. Furthermore, the state of the gas introduction hole 121 (12) of the upper electrode 120 itself which is used in the plasma etching treatment can be monitored.

(Method of Manufacturing Electrode)

Next, a method of manufacturing the electrode 10 according to the present embodiment will be described.

Figure 4:
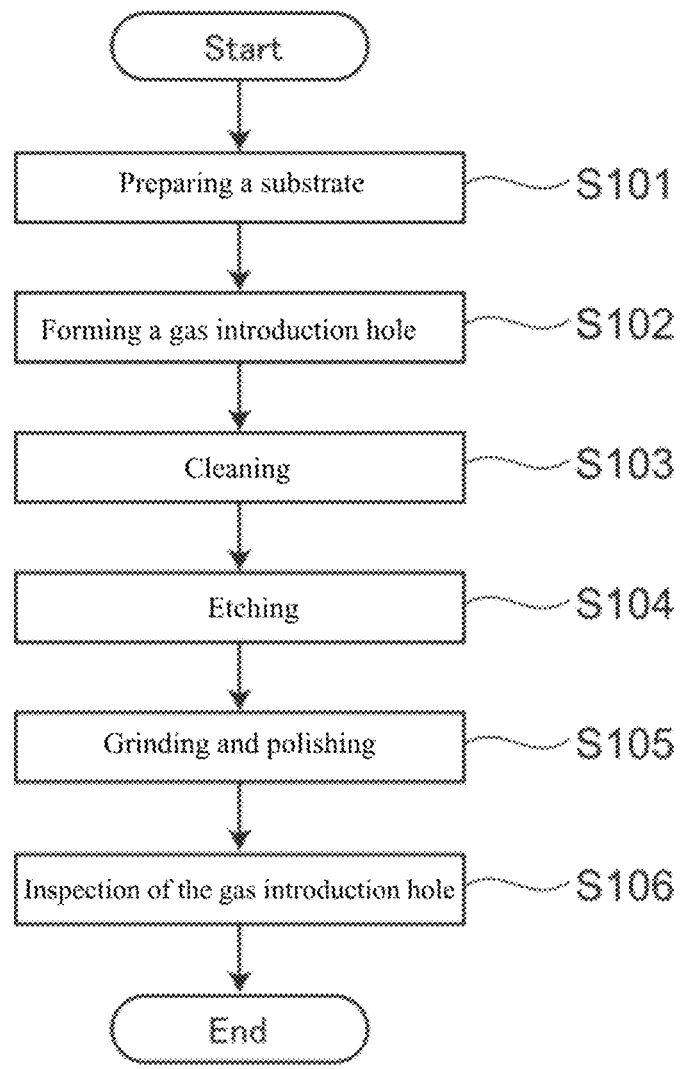
FIG. 4 is a flowchart illustrating a method of manufacturing an electrode.

FIG. 4 is a flowchart illustrating the method of manufacturing the electrode.

First, a substrate 11 is prepared (step S101). Silicon, quartz, silicon carbide or the like is used as the substrate 11. In the present embodiment, a case of using a single crystal silicon is described as an example. Here, a disk-shaped substrate 11 obtained by cutting an ingot of single crystal silicon into a thickness of about 12 mm, is prepared. After cutting out, the upper and lower surfaces of the substrate 11 are subjected to a grinding treatment, and the surface accuracy is made no more than 50 µm.

Next, a gas introduction hole 12 is formed in the substrate 11 (step S102). In the present embodiment, a sintered diamond drill is used to form the gas introduction hole 12 in the substrate 11. Here, a sintered diamond drill having a multifaceted tip is used. A perforation is conducted in the substrate 11 with a step-back method by using this sintered diamond drill. When the length of the drill is short relative to the thickness of the substrate 11, the substrate 11 may be reversed to form the hole from both sides, so as to be penetrated.

When a fine hole processing is performed on the silicon substrate 11 with a drill, a fine crushed layer will be formed on the inner wall surface of the hole. In the present embodiment, the thickness of the fine crushed layer is desirable to be 10 µm or less by the sintered diamond drill having a multifaceted tip.

When performing the drilling processing to the substrate 11, silicon sludge may adhere to the drill. For this reason, it is desirable to cleaning the substrate 11 by immersing regularly in an ultrasonic cleansing apparatus. Thereby, the performance of the drill is maintained, the occurrence of the fine crushed layer on the inner wall surface of the hole is suppressed.

Next, the substrate 11 formed with the gas introduction hole 12 is cleaned (step S103). Contaminant at the time of drilling processing adheres to such as the interior of the hole of the substrate 11 formed with the gas introduction hole 12 and the surface of the substrate 11. In order to remove this contaminant, a cleaning of the substrate 11 is performed. For example, a cleaning by a degassing ultrasonic cleansing device is performed as the cleaning herein. The contaminant adhering to the interior of the hole and the surface of the substrate 11 is cleaned by a degassing ultrasonic cleansing device formed cylindrically. By performing this cleaning, a dissolution acceleration by the etching thereafter and a suppression effect on the discoloration occurring in the substrate 11 are enhanced.

Next, the etching of the substrate 11 is performed (step S104). By this etching, the fine crushed layer formed on the inner wall surface of the gas introduction hole 12 is removed. For example, the substrate 11 is immersed in an acid solution of 40□ Thus, the surface (exposed surface) of the substrate 11 is dissolved, and the fine crushed layer of the inner wall surface of the gas introduction hole 12 is removed.

In this etching, the substrate 11 is immersed in a tank containing the acid solution, and the acid solution is circulated in the fine gas introduction hole 12 by an added rotational motion. In this case, it is preferable to perform an oscillating motion with the rotational motion. Thereby, the acid solution can be spreaded sufficiently in the interior of the gas introduction hole 12.

The immersion time of the substrate 11 is between 10 seconds or more and 1200 seconds or less. In the etching by immersion in the acid solution, verification in the rate of dissolution is resulted by the number of times or the time of the etching. To stabilize the dissolution treatment, it is desirable to manage the etching time and the number of treated sheets.

Next, a grinding and polishing of the substrate 11 is performed (step S105). Here, the periphery portion or the mounting hole of the substrate 11 is processed by using for example a milling machine. As a tool to be used, for example, a metal bond diamond, a resin bond diamond, or an electrodeposited diamond is used.

After the grinding processing, the surface of the substrate 11 is subject to a lapping processing and a surface grinding processing. By this processing, the thickness of the substrate 11 is adjusted, and at the same time, the surface roughness (arithmetic average roughness: Ra) of the substrate 11 is made for example "1" or less. Because the contaminant such as metal still adheres to the substrate 11 in the treatment so far, the etching using acid solution is performed again. This acid solution is the same as that used in step S104.

Then, the substrate 11 is cleaned by using ultra-pure water, and the substrate 11 is stored immersing in a pure water tank. Oxidation, stains and dirt of the surface of the substrate 11 are suppressed by storing in water. Next, the substrate 11 is subject to a mirror polishing in a polishing device by using for example a polish solvent containing colloidal silica. The surface roughness Ra of the substrate 11 is made for example "0.1" or less by the mirror polishing.

The substrate 11 is cleaned with pure water, dried with warm water by a warm water pulling device, after the mirror polishing. Thus, water scale, stain or the like of the substrate 11 is suppressed.

Next, an inspection of the gas introduction hole 12 is performed (step S106). As the inspection of the gas introduction hole 12 performed here, the measuring method of the present embodiment to be described later is applied. After the inspection, a final precision cleaning is performed. Thus, the electrode 10 is completed.

The electrode 10 manufactured by such method includes a gas introduction hole 12 having a very smooth inner wall surface in which the fine crushed layer has been removed. Therefore, by using this electrode 10 as the upper electrode 120, the reactive gas can be introduced uniformly, and the life elongation of the electrode 10 can be achieved by suppressing the damage to the gas introduction hole 12.

(Electrode Regeneration Method)

Figure 5:
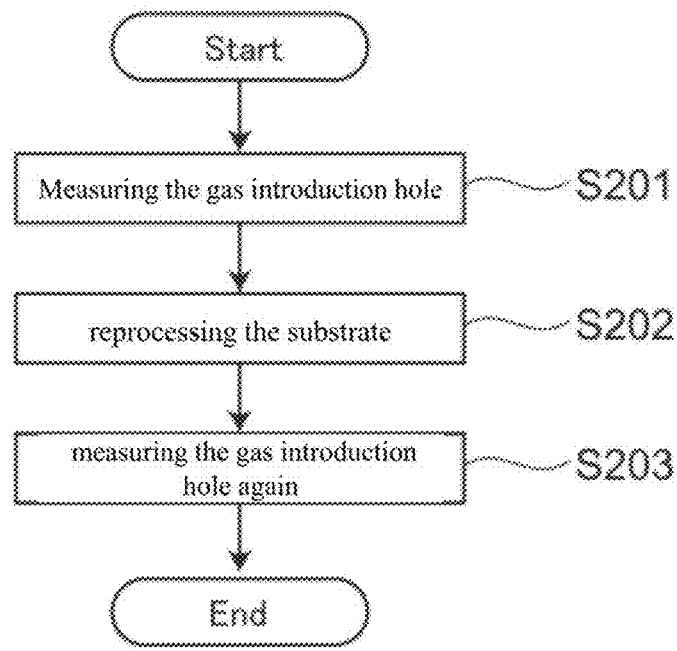
FIG. 5 is a flowchart illustrating an electrode regeneration method.

FIG. 5 is a flowchart illustrating the electrode regeneration method according to the present embodiment.

As shown in FIG. 5, the regenerating method of the electrode 10 according to the present embodiment includes: measuring the gas introduction hole 12 (step S201); reprocessing the substrate 11 (step S202); measuring the gas introduction hole 12 again (step S203). In the measurement of the gas introduction hole 12, a treatment of measuring the state of the gas introduction hole 12 of the electrode 10 has been used for a predetermined time is performed. The measuring method of the gas introduction hole 12 will be described later.

In the plasma etching device 100, depending on the treatment condition, generally, the electrode 10 will be replaced with a new one when used for about 2000 hours. In step S201, for example, the electrode 10 (electrode before regeneration 10B) that has passed 2000 hours is taken out from the plasma etching device 100, and the state of the gas introduction hole 12 is nondestructively measured by the measuring method described later.

The state of the gas introduction hole 12 to be measured is, for example, at least one of the diameter, the inner wall surface roughness and the degree of perpendicularity of the gas introduction hole 12. Further, in the measurement, the size of a rounded region of an opening in the gas discharge side of the gas introduction hole 12 may be measured.

In the reprocessing of the substrate 11 of step S202, at least one of the polishing of the surface of the substrate 11 and the processing of the inner wall surface of the gas introduction hole 12 is performed based on the measurement result of step S201. In step S202, an optimum processing method is selected base on the measurement result of step S201.

For example, when the inner wall surface roughness of the gas introduction hole 12 is within a previously set range, the polishing of the surface of the substrate 11 is performed. That is, since the inner wall surface roughness of the gas introduction hole 12 is within the specified range in this case, the treatment for the inner wall surface is determined to be unnecessary. Since the surface of the substrate 11 becomes rough with using, regeneration is performed by polishing the surface of the substrate 11.

Here, when the size of the rounded region of the opening of the gas introduction hole 12 is measured, it is possible to calculate the polishing amount that can remove the roundness from the size of this region. By performing the polishing of this polishing amount, an electrode 10 removed of the roundness of the opening of the gas introduction hole 12 can be regenerated.

Figure 6:
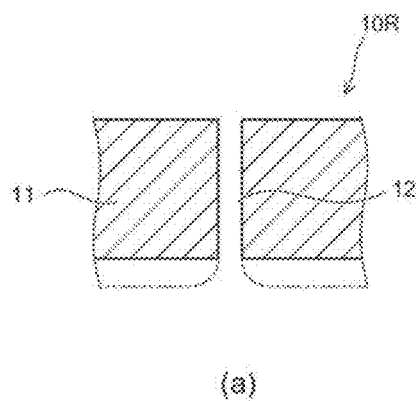
FIGS. 6 (a) and (b) are sectional views showing an example of a reprocessing.
Figure 6:
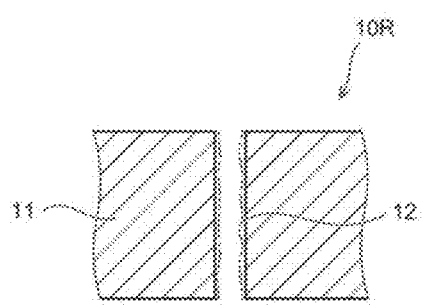

The regenerated electrode 10R removed of the roundness of the opening of the gas introduction hole 12 is shown in FIG. 6 (a). Roundness is likely to occur in the opening of the gas discharge side of the gas introduction hole 12 with using. By polishing the surface of the substrate 11, a gas introduction hole 12 in which the roundness of the opening has been removed can be obtained by regeneration. One example of the surface processing of the substrate 11, first, grinds the surface of the gas discharge side of the substrate 11, and carries out a R-chamfering of the edge of the substrate 11. Next, a lapping of the surface of the substrate 11 is performed, and then an etching is conducted followed by polishing.

Further, when the inner wall surface roughness of the gas introduction hole 12 is within the previously set range, the processing of the inner wall surface of the gas introduction hole 12 is performed. The processing of the inner wall surface is at least one of a perforation processing for increasing the diameter of the gas introduction hole 12 and an etching processing of the inner wall surface of the gas introduction hole 12.

In the case of removing only the inner wall surface roughness of the gas introduction hole 12, it is desirable to conduct the etching processing. Thus, an electrode 10 having a gas introduction hole 12 with a smooth inner wall surface is regenerated, without changing the diameter of the gas introduction hole 12 substantially.

Further, in the case where it is insufficient to remove only the inner wall surface roughness of the gas introduction hole 12, or the case where it is desirable to regenerate as an electrode 10 having a gas introduction hole 12 with larger diameter than that of the original gas introduction hole 12, the perforation processing for enlarging the diameter of the gas introduction hole 12 is conducted. This perforation processing is a processing for performing a perforation again with a drill larger than the original hole diameter based on the original gas introduction hole 12. Thus, the regeneration is performed to obtain an electrode 10 having a gas introduction hole 12 in which the diameter has been enlarged based on the original gas introduction hole 12.

The regenerated electrode 10R in which the gas introduction hole 12 has been subject to the perforation again is shown in FIG. 6 (b). The diameter of the gas introduction hole 12 is enlarged by being perforated again, but a gas introduction hole 12 having a smooth inner surface wall by removing the inner wall surface roughness can be obtained by regeneration.

Incidentally, when performing the perforation processing, because sometimes burrs will occur on the inner wall surface of the gas introduction hole 12, the etching processing is desirable to be performed after the perforation processing. Thereby, an electrode 10 having a gas introduction hole 12 with a smooth inner wall surface is obtained by regeneration through removing the burrs on the inner wall occurred in the perforation processing.

After performing the processing, as shown in step S203, the measurement of the state of the processed gas introduction hole 12 is performed. This measuring method is the same as the measuring method performed in step S201. By this measurement, the state (for example, the diameter, the inner wall surface roughness, and the degree of perpendicularity) of the processed gas introduction hole 12 is measured nondestructively. Thus, the state of the gas introduction hole 12 of the regenerated electrode 10 can be grasped objectively.

According to the measurement result of step S203, for example, one with the diameter of the gas introduction hole 12 being within the previously set fixed range may be determined as a good product. The same applies to the inner wall surface roughness or the degree of perpendicularity. Further, since the state of the gas introduction hole 12 can be measured objectively, an electrode 10 having a gas introduction hole 12 consistent with the specification is possible to be obtained by regeneration.

(Measuring Method of Gas Introduction Hole)

Next, the measuring method of the gas introduction hole 12 will be described.

Figure 7:
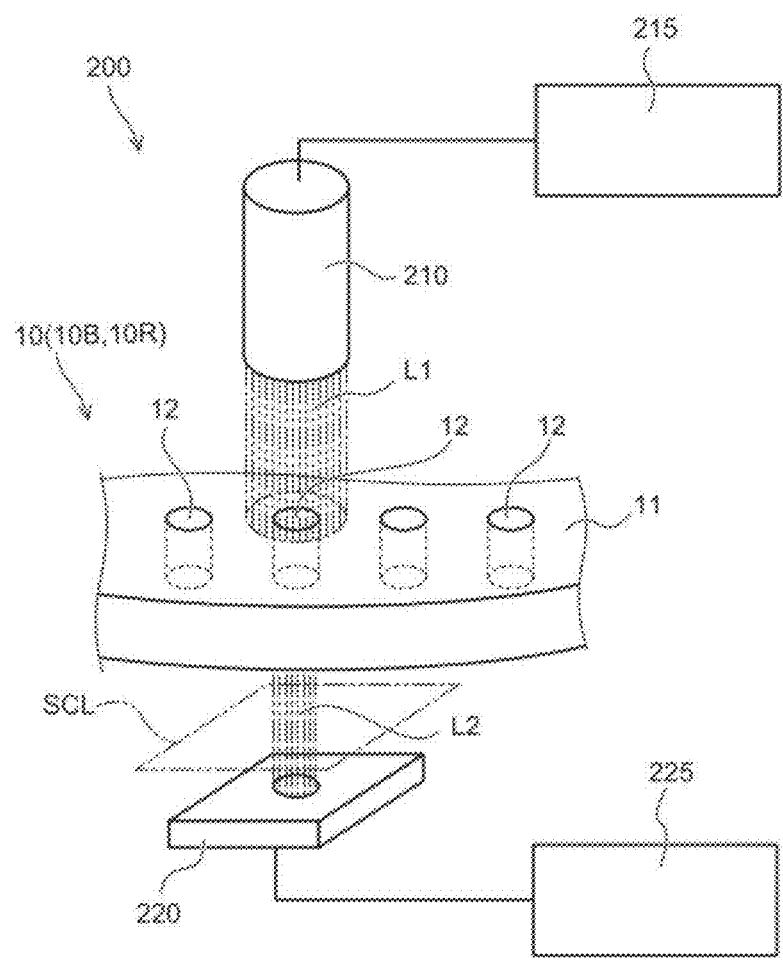
FIG. 7 is a schematic view illustrating a measuring method of a gas introduction hole according to the present embodiment.

FIG. 7 is a schematic view illustrating the measuring method of the gas introduction hole according to the present embodiment.

As shown in FIG. 7, the measuring method of the gas introduction hole according to the present embodiment is a method for performing a measurement base on the photoreception image, by irradiating the light L1 from the light-emitting part 210 to the gas introduction hole 12, and receiving the light L2 transmitted through the gas introduction hole 12.

The measuring device 200 for measuring the gas introduction hole 12 includes a light-emitting part 210, a controller 215, a light receiving part 220 and an image processing part 225. The light-emitting part 210 emits such as laser light or LED light. As previously described, the light-emitting part 210 may be provided movably to the holding part 141 of the upper electrode 120. A coherent light is desirable as the light L1 used in the measurement. In the present embodiment, a laser light source emitting laser light is used as the light-emitting part 210. The controller 215 controls the amount and emission timing of the light L1 emitted from the light-emitting part 210.

With respect to the wavelength of the light L1 emitted from the light-emitting part 210, for example, red of 620 nm or more and 750 nm or less, green of 495 nm or more and 570 nm or less, blue of 450 nm or more and 495 nm or less, infrared of 750 nm or more and 1400 nm or less is used.

The spot diameter of the light L1 is larger than the inner diameter of the gas introduction hole 12. Thereby, the light L1 is actually incident in the gas introduction hole 12. The light L1 is emitted substantially perpendicular to the surface of the substrate 11. Here, "substantially perpendicular" refers to that in the case where the thickness of the substrate 11 is t, the diameter of the gas introduction hole 12 is d, it is less than tan (d/t) ° with respect to the perpendicular direction.

The light receiving part 220 is an area sensor which receives the light L2 transmitted through the gas introduction hole 12 as a two-dimensional image. The light L2 is the transmitted light of the light L1 emitted from the light-emitting part 210, which has passed through the gas introduction hole 12. The light receiving part 220 receives this light L2 as a two-dimensional image and converts the same into an electric signal.

Incidentally, even in the case of using infrared as the light L1, the light receiving part 220 will receive the light transmitted through the gas introduction hole 12 without receiving the light transmitted through the substrate 11. That is, in the case of using infrared as the light L1, although there is also light transmitted through the substrate 11, the light receiving part 220 does not receive the light transmitted through the substrate 11, but receives the light which goes through the gas introduction hole 12.

Here, the light receiving part 220 may directly receive the light L2 transmitted through the gas introduction hole 12, or receive the light L2 via a translucent screen SCL. The translucent screen SCL is disposed between the substrate 11 and the light receiving part 220. The translucent screen SCL may also be provided movably forward and backward together with the light receiving part 220. Further, the translucent screen SCL may be closely attached to the surface of the substrate 11. When the intensity of the light L2 is high, if the image of the light L2 projected onto the translucent screen SCL is received by the light receiving part 220, a filter effect due to the translucent screen SCL is obtained.

The image processing part 225 performs an image processing based on the electric signal output from the light receiving part 220, and performs the measurement of the gas introduction hole 12. That is, the image processing part 225 performs the image processing on the two-dimensional image of the light L2 received by the light receiving part 220, and outputs the state of the gas introduction hole 12 as a measurement result based on this processing result.

In the measuring method of the gas introduction hole 12 according to the present embodiment, by using the fact that the amount, the route, the reflection state and the like of the light L2 transmitted through the gas introduction hole 12 change depending on the state of the gas introduction hole 12, the state of the gas introduction hole 12 is measured nondestructively based on the two-dimensional image of the light L2. A number of very thin gas introduction holes 12 provided in the electrode 10 are provided in the substrate 11 with high aspect ratio. Therefore, it is not possible to inspect from the surface image the electrode 10 to the interior of the gas introduction hole 12. Moreover, even an X-ray image is obtained in the direction along the surface, a highly accurate measurement cannot be performed because of the duplication with an image of another gas introduction hole 12. When desiring to perforate the gas introduction hole 12 with a drill and specify the inner surface roughness, it is not known until the electrode 10 is destroyed. As in the present embodiment, it is possible to irradiate the light L1 to the gas introduction hole 12, receive the two-dimensional image of the light L2 transmitted, and nondestructively measure the gas introduction hole 12 highly accurately from the correlation between the two-dimensional image and the state of the gas introduction hole 12.

Next, the correlation between the gas introduction hole 12 and the two-dimensional image of the light L2 will be described.

Figure 8:
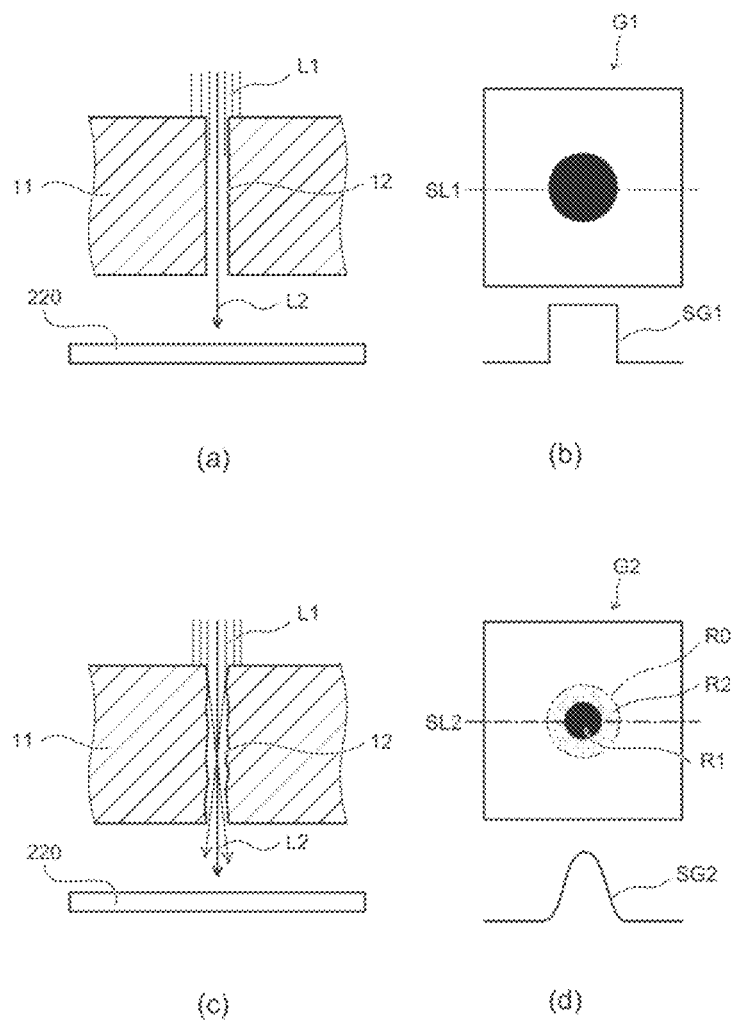
FIGS. 8 (a) to (d) are schematic views illustrating a relationship between the state of the gas introduction hole and the image.
Figure 9:
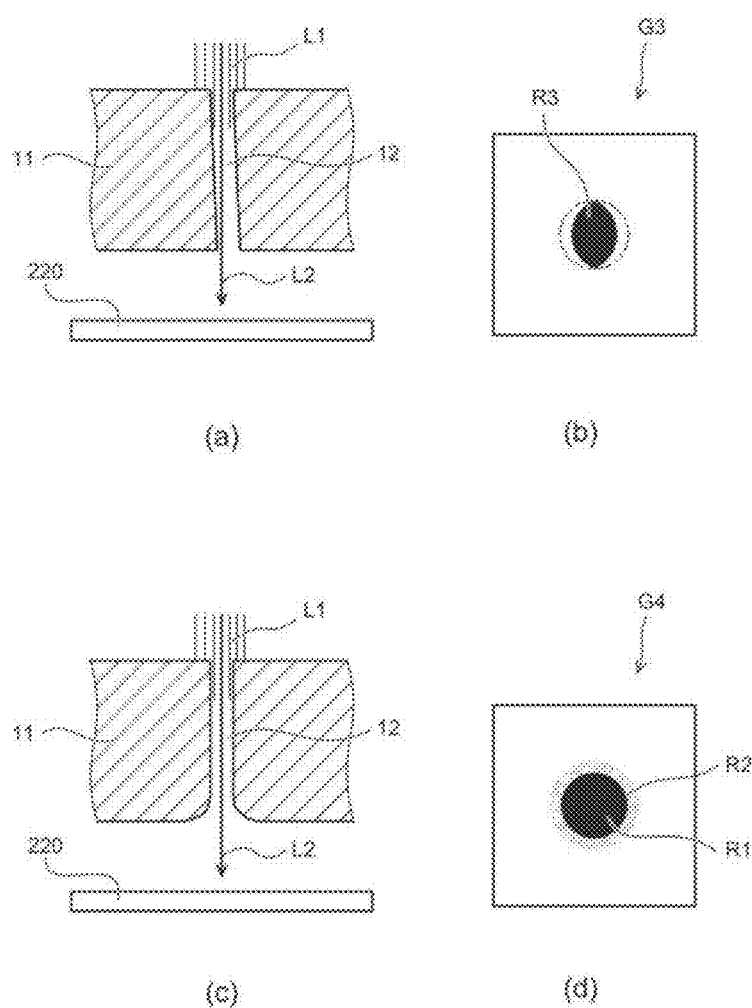
FIGS. 9 (a) to (d) are schematic views illustrating a relationship between the state of the gas introduction hole and the image.

FIG. 8 (a) to FIG. 9 (d) are schematic views illustrating the relationship between the state of the gas introduction hole and the image.

In FIG. 8 (a), a cross-sectional view of the gas introduction hole 12 provided substantially perpendicularly to the substrate 11 and having an inner wall surface with high flatness is shown. When irradiating the light L1 to such gas introduction hole 12, much of the light L1 will go through the gas introduction hole 12 directly.

In FIG. 8 (b), an example of the two-dimensional image G1 of the light L2 transmitted through the gas introduction hole 12 shown in FIG. 8 (a) is represented. In this two-dimensional image G1, the image of the gas introduction hole 12 appears sharply. In FIG. 8 (b), an example of the signal SG1 on the scanning line SL1 of the two-dimensional image G1 is shown. The image processing part 225 calculates a change (inclination etc.) in the signal SG1 along the scanning line SL1 of the two-dimensional image G1. For example, the flatness of the inner wall surface of the gas introduction hole 12 can be measured according to the signal change (differential value, second differential value etc.) at the border portion of the signal SG1. Further, the image processing part 225 can measure the degree of circularity of the gas introduction hole 12 from the border of the two-dimensional image G1.

In FIG. 8 (c), a cross-sectional view of the gas introduction hole 12 having an inner wall surface of which the flatness is not high, is shown. When the light L1 is irradiated to such gas introduction hole 12, the light L1 hits against the unevenness of the inner wall surface of the gas introduction hole 12, and is transmitted while being repeatedly reflected.

In FIG. 8 (d), an example of the two-dimensional image G2 of the light L2 transmitted through the gas introduction hole 12 shown in FIG. 8 (c) is represented. In this two-dimensional image G2, the image of the gas introduction hole 12 appears sharply. In FIG. 8 (d), an example of the signal SG2 on the scanning line SL2 of the two-dimensional image G2 is shown. The image processing part 225 can measure the flatness of the inner wall surface of the gas introduction hole 12 according to the signal change at the border portion of the signal SG2. In the two-dimensional image G2, the signal change at the border portion is slow compared to the two-dimensional image G1. The flatness of the inner wall surface of the gas introduction hole 12 can be measured according to this signal change.

Furthermore, the image processing part 225 may divide the two-dimensional image G2 into regions of a central region (a region with high brightness) R1, and a peripheral region (a region with a brightness lower than the central region R1) R2 from the change of the signal SG2, and quantitatively acquire the flatness of the inner wall surface of the gas introduction hole 12 according to the ratio of these areas. For example, the entire region representing the two-dimensional image G2 is referred to as R0, and the flatness of the inner wall surface is acquired by the proportion of the area of the peripheral region R2 with respect to the area of the region R0. The lower (many unevenness) the flatness of the inner wall surface is, the higher the proportion of the area of the peripheral region R2 becomes with respect to the area of the region R0. By utilizing this characteristic, the flatness of the inner wall surface can be acquired quantitatively.

In FIG. 9 (a), the cross-sectional view of the gas introduction hole 12 provided obliquely to the substrate 11 is shown. When the light L1 is irradiated to such gas introduction hole 12, a portion of the light L1 entered the gas introduction hole 12 will be blocked by the inner wall surface.

In FIG. 9 (b), an example of the two-dimensional image G3 of the light L2 transmitted through the gas introduction hole 12 shown in FIG. 9 (a) is represented. In this two-dimensional image G3, although the border portion appears sharply, the entire shape is not a perfect circle. That is, due to the deviation between the center of the opening of the light entrance side and the center of the opening of the light exit side of the gas introduction hole 12, the light is only transmitted through the region R3 where the two openings overlaps when viewed from directly above the substrate 11. Therefore, the two-dimensional image G3 is a substantially elliptical shape corresponding to the region R3. The image processing part 225 can measure the degree of perpendicularity with respect to the substrate 11 of the gas introduction hole 12 base on the shape of the two-dimensional image G3. The degree of perpendicularity includes, for example, besides the angle relative to the vertical axis with respect to the surface of the substrate 11 of the gas introduction hole 12, the fact whether or not the angular deviation from the vertical axis is within an allowable range.

In FIG. 9 (c), a cross-sectional view of the gas introduction hole 12 in which the corner of the opening of the gas ejecting side is consumed, is shown. When the electrode 10 is deteriorated, the corner of the opening of the gas ejecting side of the gas introduction hole 12 will be rounded. When irradiating the light L1 to such gas introduction hole 12, much of the light L1 goes through the gas introduction hole 12 directly. Further, a portion of the light L1 will hit the corner of the opening of the gas ejecting side of the gas introduction hole 12 and become scattered.

In FIG. 9 (d), an example of the two-dimensional image G4 of the light L2 transmitted through the gas introduction hole 12 shown in FIG. 9 (c) is represented. In this two-dimensional image G4, together with the image of the gas introduction hole 12 appearing sharply in the central region R1, an image of the scattered light appears in the peripheral region R2 thereof. The image processing part 225 can determine that the corner of the opening of the gas ejecting side of the gas introduction hole 12 is rounded, when the size of the relatively sharp image appearing in the central region R1 is approximately the same as the diameter of the gas introduction hole 12, and the image of the scattered light appears in the peripheral region R2 thereof.

Further, when the fact that the corner of the opening of the gas ejecting side has been rounded is determined, the size of the roundness of the corner is determined according to the area of the peripheral region R2. That is, the larger the roundness of the corner is, the larger the area of the peripheral region R2 becomes. By utilizing this characteristic, the size of the roundness of the corner of the gas ejecting side can be acquired quantitatively.

In this way, in the measuring method of the gas introduction hole 12 according to the present embodiment, it is possible to nondestructively measure what kind of state the gas introduction hole 12 is, through treating the two-dimensional image in the image processing part 225 by utilizing the relationship between the two-dimensional image of the light L2 received by the light receiving part 220 and the state of the gas introduction hole 12.

Further, since the state of the gas introduction hole 12 can be measured by the measuring method according to the present embodiment, the lifetime of the electrode 10 of the plasma etching device 100 can be determined based on this measurement result. First, the state of the gas introduction hole 12 before being used as the electrode 10 (new) is measured by the measuring method according to the present embodiment. Next, the state of the gas introduction hole 12 of the electrode 10 which has been used for a certain time is measured by the same method.

When this state of the gas introduction hole 12 measured after use is beyond the predetermined specification, the electrode 10 will be determined to have reached the end of the lifetime. Further, by measuring the state of the gas introduction hole 12 regularly, it is possible to predict the remaining lifetime of the electrode 10 base on the change of the measurement result.

Figure 10:
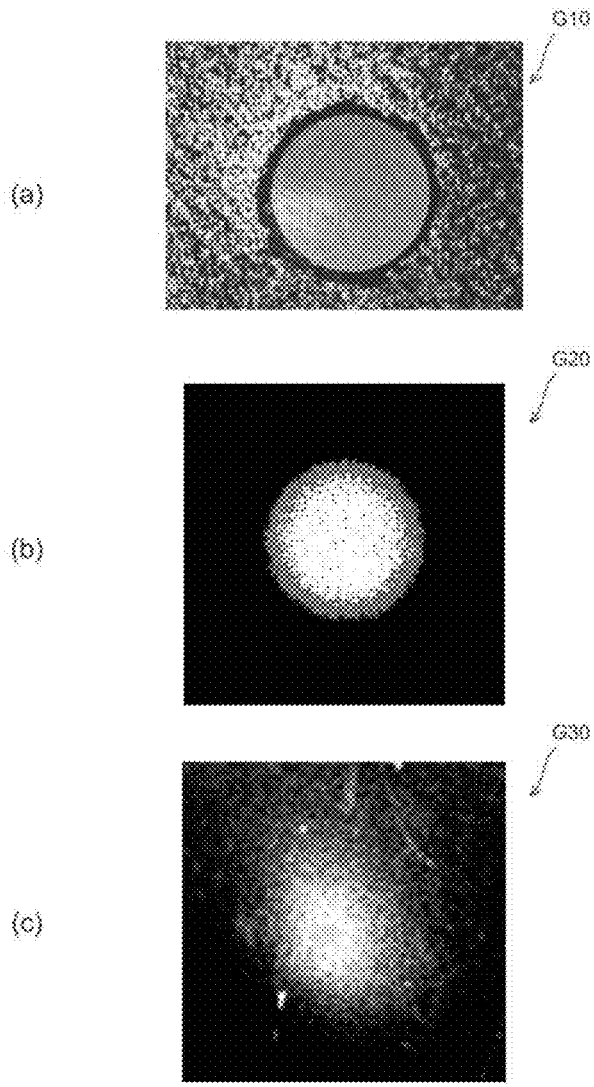
FIGS. 10 (a) to (c) are photographs showing the gas introduction hole and the two-dimensional images.

FIGS. 10 (a) to (c) are photographs showing the two-dimensional images of the gas introduction hole.

In FIG. 10 (a), a two-dimensional image G10 of the gas introduction hole 12 before the use of the electrode 10 using silicon, is shown. This image is obtained by directly photographing the light L2 transmitted through the gas introduction hole 12 with the light receiving part 220. Before use, the contour of the two-dimensional image G10 appeared sharply.

In FIG. 10 (b), a two-dimensional image G20 of the gas introduction hole 12 after the use of the electrode 10 using silicon, is shown. This image is obtained by projecting the light L2 transmitted through the gas introduction hole 12 to the translucent screen SCL and photographing by the light receiving part 220. This electrode 10 has been used for about 2000 hours by the plasma etching device 100. After use, it can be seen that the contour of the two-dimensional image G20 is blurred. Further, a change in color tone (or light and shade) is observed in correspondence to the portion where unevenness has occurred in the inner wall surface of the gas introduction hole 12 of the two-dimensional image G20. Based on the region has been changed, the state of the inner wall surface of the gas introduction hole 12 can be measured quantitatively.

In FIG. 10 (c), a two-dimensional image G30 of the gas introduction hole 12 before the use of the electrode 10 using quartz, is shown. This image is obtained by projecting the light L2 transmitted through the gas introduction hole 12 to the translucent screen SCL and photographing by the light receiving part 220. In the electrode 10 using quartz, since the irradiated light hits the peripheral substrate 11 of the gas introduction hole 12 and is scattered, a sharp two-dimensional image G30 is not formed. However, by using the signal waveform of the two-dimensional image G30, the state of the gas introduction hole 12 can be measured from the difference of the signal waveform before and after use.

The diameter d of the gas introduction hole 12 which is the measuring object, is very small, also, the ratio of the diameter d with respect to the thickness t is about several percentages. In this way, when the image of the light transmitted through the gas introduction hole 12 by irradiating the light to the greatly elongated gas introduction hole 12, a special image unobtainable in the normal measurement using light for object can be obtained. For example, when a blue laser light is irradiated to the gas introduction hole 12 provided on the substrate 11 made of silicon monocrystal, the change of color in the portion corresponding to the unevenness of the inner wall surface of the gas introduction hole 12 is observed in the two-dimensional image of the light transmitted through the gas introduction hole 12. Thus, by utilizing the relationship with the material of the substrate 11, the wavelength of the light, and the state of the gas introduction hole 12, a characteristic measurement different from the method of performing the measurement from the image obtained by simply irradiating light.

(Another Measuring Method of Gas Introduction Hole)

Next, another measuring method of the gas introduction hole 12 will be described.

Figure 11:
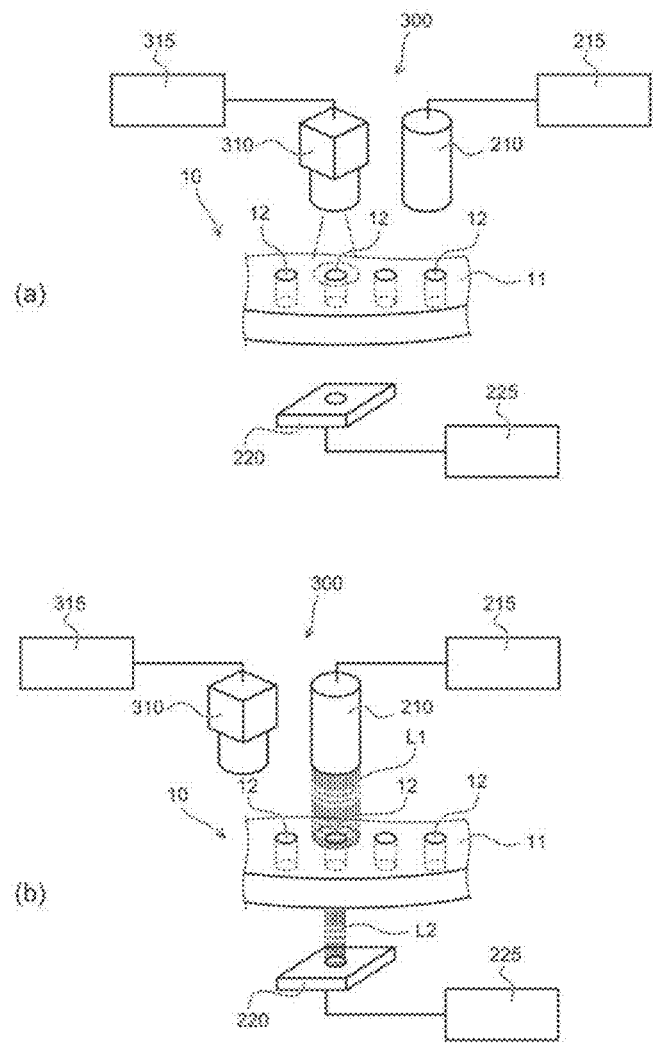
FIGS. 11 (a) and (b) are schematic views illustrating another measuring method of the gas introduction hole.

FIGS. 11 (*a*) and (*b*) are schematic views illustrating another measuring method of the gas introduction hole.

This measuring method is a method of obtaining the image (opening portion image) of the gas introduction hole 12 from the surface side of the substrate 11, together with obtaining the above described two-dimensional image caused by the irradiation of the light L1, so as to perform the measurement based on these images The measuring device 300 for performing this measurement includes a camera 310 and an image processing part 315, in addition to the above mentioned configuration of measuring device 200. The camera 310 captures the image of the surface of the electrode 10. The camera 310 may be provided movably to the holding part 141 of the electrode 10. The image of the opening portion of the light L1 incident side of gas introduction hole 12 is obtained by the camera 310. The image processing part 315 performs the processing of the opening portion image obtained by the camera 310. Incidentally, the image processing part 315 may be also used as the image processing part 225.

To perform the measurement of the gas introduction hole 12 by this measuring device 300, first, as shown in FIG. 11 (*a*), the opening portion image of the gas introduction hole 12 is obtained by the camera 310. That is, the camera 310 is arranged immediately above the gas introduction hole 12 to be measured, so as to obtain the opening portion image of the gas introduction hole 12.

Next, as shown in FIG. 11 (*b*), the light-emitting part 210 is arranged immediately above the gas introduction hole 12 to be measured, at the same time, the light receiving part 220 is arranged immediately below the gas introduction hole 12. Then, the light L1 is irradiated from the light-emitting part 210 to the gas introduction hole 12, and the two-dimensional image of the light L2 transmitted through the gas introduction hole 12 is obtained by the light receiving part 220.

Next, while processing the opening portion image obtained by the camera 310 in the image processing part 315, the state of the gas introduction hole 12 is measured by processing the two-dimensional image obtained by the light receiving part 220. That is, in this measuring method, the state of the gas introduction hole 12 is measured nondestructively by using both of the opening portion image of the gas introduction hole 12 obtained by the camera 310, and the two-dimensional image of the light L2 transmitted through the gas introduction hole 12.

Figure 12:
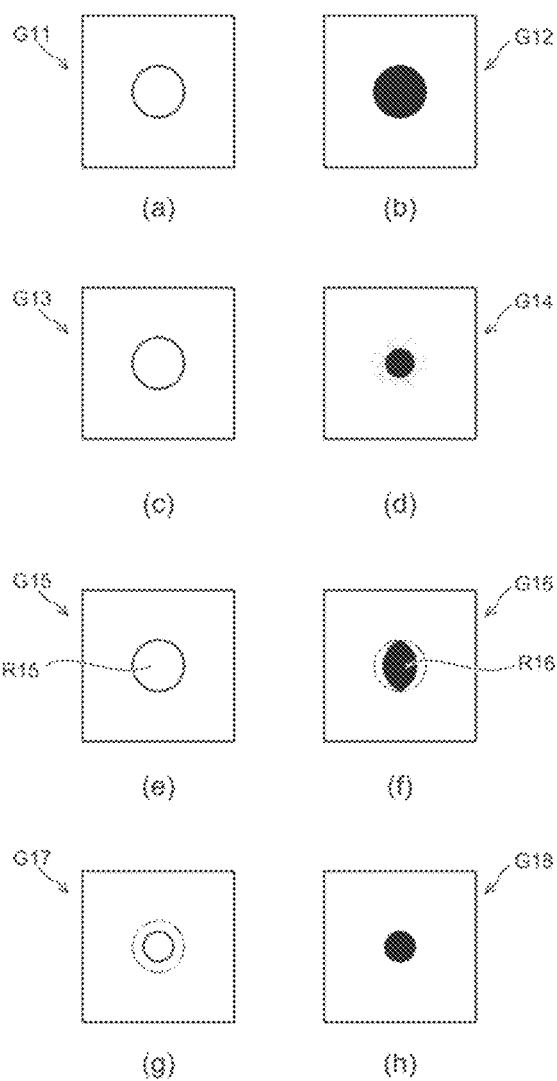
FIGS. 12 (a) to (h) are schematic views illustrating the images and the two-dimensional images obtained by a camera.

FIGS. 12 (*a*) to (*h*) are schematic views illustrating the images and the two-dimensional images obtained by a camera.

In FIGS. 12 (*a*), (*c*), (*e*) and (*g*), examples of opening portion images obtained by the camera 310 are shown, and in FIGS. 12 (*b*), (*d*), (*f*) and (*h*), the two-dimensional images obtained by the light receiving part 220 are shown.

The example shown in FIGS. 12 (*a*) and (*b*), is the measuring example of the gas introduction hole 12 shown in FIG. 8 (*a*). This gas introduction hole 12 has an inner wall surface with high flatness, and is provided substantially perpendicularly to the substrate 11. In such a case, the diameter of the opening portion image G11 obtained by the camera 310 shown in FIG. 12 (*a*) is substantially equal to the diameter of the two-dimensional image G12 obtained by the light receiving part 220 shown in FIG. 12 (*b*). Further, the two-dimensional image G12 appears sharply. Therefore, in the case where such opening portion image G11 and two-dimensional image G12 have been obtained, a straight hole is formed from the inlet to the outlet of the gas introduction hole 12, and the flatness of the inner wall surface is also determined to be high.

The example shown in FIGS. 12 (*c*) and (*d*), is the measuring example of the gas introduction hole 12 shown in FIG. 8 (*c*). This gas introduction hole 12 has an inner wall surface of which the flatness is not high. In such a case, the diameter of the opening portion image G13 obtained by the camera 310 shown in FIG. 12 (*c*) is substantially equal to the design value of the diameter of the gas introduction hole 12. The two-dimensional image G14 obtained by the light receiving part 220 shown in FIG. 12 (*d*) does not appear sharply. Therefore, in the case where such opening portion image G13 and two-dimensional image G14 have been obtained, although a gas introduction hole 12 with a diameter close to the design value is formed, the flatness of the inner wall surface is determined to be not high.

The example shown in FIGS. 12 (*e*) and (*f*), is the measuring example of the gas introduction hole 12 shown in FIG. 9 (*a*). This gas introduction hole 12 is formed obliquely with respect to the substrate 11. In such a case, the diameter of the opening portion image G15 obtained by the camera 310 shown in FIG. 12 (*e*) is substantially equal to the design value of the diameter of the gas introduction hole 12. The two-dimensional image G16 obtained by the light receiving part 220 shown in FIG. 12 (*f*) is a substantially elliptical shape corresponding to the region R16. Therefore, in the case where such opening portion image G15 and G16 have been obtained, although a gas introduction hole 12 with a diameter close to the design value is formed, it is determined to be formed obliquely with respect to the substrate 11.

Figure 13:
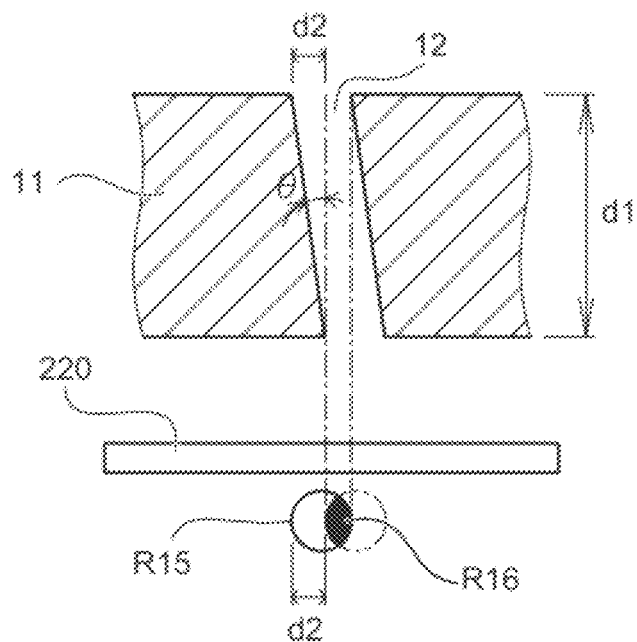
FIG. 13 is a schematic view illustrating the angle of the gas introduction hole.

Further, the inclination angle is calculated according to the distance between the light receiving part 220 and the edge of the gas introduction hole 12 of the substrate 11. As shown in FIG. 13, when setting the thickness of the substrate 11 as d1, and setting the distance between the position of the edge of the gas introduction hole 12 projected on the light receiving part 220 and the position of the edge of the gas introduction hole 12 of the substrate 11 side which is along the light receiving surface as d2, the inclined angle θ of the gas introduction hole 12 can be calculated by $\tan^{-1}(d2/d1)$.

The example shown in FIGS. 12 (*g*) and (*h*) is a measuring example in the case where the diameter of the gas introduction hole 12 is small. The diameter of this gas introduction hole 12 is smaller than the design value. In such a case, the diameter of the opening portion image G17 obtained by the camera 310 shown in FIG. 12 (*g*) is substantially equal to the diameter of the two-dimensional image G18 obtained by the light receiving part 220 shown in FIG. 12 (*h*). However, this diameter is smaller than the design value. Therefore, in the case where such opening portion image G17 and two-dimensional image G18 have been obtained, although a straight hole is formed from the inlet to the outlet of the gas introduction hole 12, the diameter is determined to be smaller than the design value.

Incidentally, in the case of a gas introduction hole 12 having a diameter larger than the design value, the diameter thereof appears larger than the design value, together with that the diameter of the opening portion image obtained by the camera 310 is substantially equal to the diameter of the two-dimensional image obtained by the light receiving part 220.

Thus, the state of the gas introduction hole 12 is possible to be measured with more details based on the relationship between the image obtained by the camera 310, and the two-dimensional image obtained by the light receiving part 220. It should be noted that, the above are merely examples, and various states of the gas introduction hole 12 are possible to be measured by the combination of these examples or other relationships.

Particularly, the measuring method of the gas introduction hole 12 according to the present embodiment is suitable for measuring the gas introduction hole 12 having an excellent flatness of the inner wall surface, because the measurement is performed by irradiating the light L1 to the gas introduction hole 12 and receiving the light L2 transmitted through the gas introduction hole 12. Therefore, it is particularly effective for measuring the gas introduction hole 12 in which the inner wall surface has been flattened by the etching treatment, after perforating the substrate 11 by the drilling processing.

Further, the substance generated by performing dry etching in the plasma etching device 100 may adhere to the inner wall of the gas introduction hole 12. Even the substance adheres to the gas introduction hole 12 as such, the adhering state of substance can be measured quantitatively by capturing the light L2 transmitted through the gas introduction holes 12.

Incidentally, although in the measuring method of the gas introduction hole 12 according to the present embodiment, the gas introduction hole 12 has been described as a straight hole provided from one surface to the other surface of the substrate 11, it may be described as a gas introduction hole 12 which is bent in the middle of the substrate 11. Even the gas introduction hole 12 is bent, the light L1 irradiated from one surface side of the substrate 11 can proceed while being reflected by the inner wall of the gas introduction hole 12, and become light L2 to be captured by the light receiving part 220. By using a light with a wavelength which does not pass the substrate 11 as the light L1, even the gas introduction hole 12 is bent, the light that has passed through the inside of the gas introduction hole 12 can be received by the light receiving part 220, and the state of the gas introduction hole 12 can be measured.

Further, the uniformity of the gas introduction hole 12 can be determined by applying the measuring method of the gas introduction hole 12 according to the present embodiment. Therefore, the electrode 10 can be selected so that in the electrode 10 including a plurality of gas introduction holes 12 on the substrate 11, the light L1 irradiated from one surface side of the substrate 11 reaches the other surface side of the substrate 11 via the plurality of gas introduction holes 12.

In this selection, if the variation (for example, standard deviation a) in the intensity of the light L2 transmitted through the plurality of gas introduction holes 12 is no more than the previously set fixed value in the electrode 10, the electrode 10 can be determined to be good.

With the plasma etching device 100 using the above described electrode 10 (the electrode capable of transmitting the light L1 in the plurality of gas introduction holes 12, or the electrode in which the variation in the intensity of the light L2 is no more than a fixed value) as the upper electrode 120, the reactive gas can be introduced between the upper electrode 120 and the lower electrode 130 with high uniformity, and a stable treatment can be applied to the object W.

As for the gas introduction hole in the electrode used for the plasma etching device, various forms have been considered from the view point of uniformity, maintenance and the like in the introduction of the reaction gas. However, in any form, when applied to an actual gas introduction hole of an electrode, it is difficult to gasp nondestructively whether or not the set shape has been formed.

With the measuring method of the gas introduction hole 12 according to the present embodiment, the electrode 10 itself that is actually used (or being used) in the plasma etching device 100 can be measured nondestructively, and an objective data of the gas introduction hole 12 can be obtained. The inventor of the present application have obtained a new finding that the objective data of the gas introduction hole 12 can be obtained by such measuring method. Then, the state of the plurality of gas introduction holes 12 is identified by measuring with the measuring method of the gas introduction hole 12 according to the present embodiment, and a dry etching with the plasma etching device 100 is performed by using the electrode 10 which has been subject to the measurement. Thus, an improvement in the processing characteristics, the yield, and the productivity of the dry etching can be realized.

Further, since the state of the clogging of the gas introduction hole 12, the spreading of the inner diameter of the gas introduction hole 12, and the adhesion of the deposits to the inner wall surface of the gas introduction hole 12 of the electrode 10 actually used in the plasma etching device 100 can be grasped, it is possible to reduce or avoid the risk that the semiconductor element becomes defective due to dropping of the deposits from the electrode 10 onto the silicon wafer or floating of the deposits as particles in the chamber.

(State Distribution Diagram)

Figure 14:
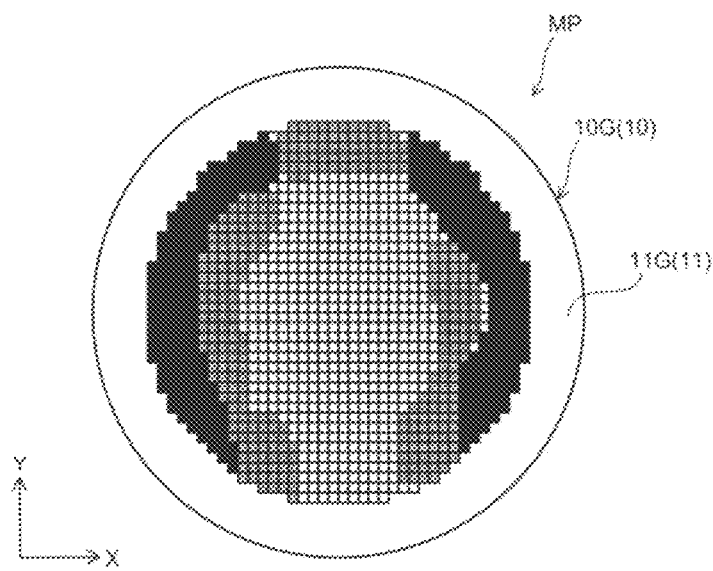
FIGS. 14 (a) and (b) are diagrams for explaining a state distribution diagram according to the present embodiment.

FIGS. 14 (a) and (b) are diagrams for explaining the state distribution diagram according to the present embodiment. In FIG. 14 (a), one example of the state distribution diagram MP is shown, and in FIG. 14 (b), one example of the data for creating a state distribution diagram is shown.

As shown in FIG. 14 (a), the state distribution diagram MP according to the present embodiment is a diagram for displaying the state of the plurality of gas introduction holes provided to penetrate the substrate 11 of the electrode 10 for the plasma etching device in the thickness direction. The state distribution diagram MP is for displaying the state of each of a plurality of gas introduction holes in correspondence to the positions of the plurality of gas introduction holes in the surface of the substrate 11 in a display mode corresponding to this state.

Here, upon performing the detailed description of the state distribution diagram MP according to the present embodiment, the electrode 10 for the plasma etching device, the manufacturing methods of the plasma etching device using this electrode 10 and the electrode 10 are described.

(Displaying Method of State Distribution Diagram)

Next, the displaying method of the state distribution diagram will be described.

Figure 15:
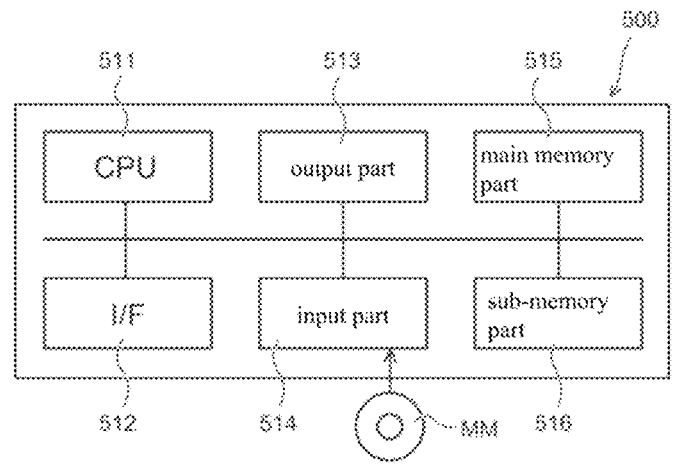
FIGS. 15 (a) and (b) are diagrams for explaining a displaying method of the state distribution diagram.
Figure 15:
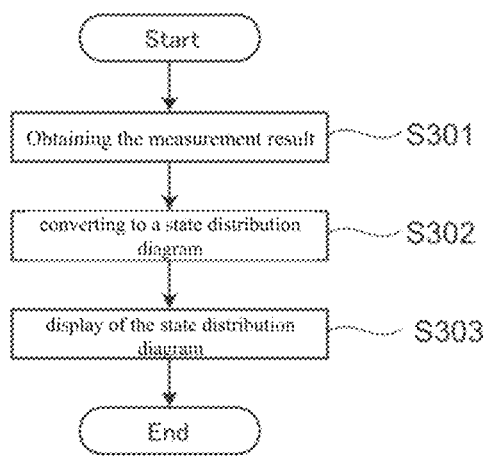

FIGS. 15 (a) and (b) are diagrams for explaining the displaying method of the state distribution diagram. In FIG. 15 (a), the configuration of the computer 500 for displaying the state distribution diagram MP is shown, and in FIG. 15 (b), the flowchart illustrating the displaying method of the state distribution diagram MP is shown.

The displaying method of the state distribution diagram MP is realized, for example, by a program processing with a computer 500. This program is recorded in a medium such as a CD-ROM, or stored in a memory device such as a server, or distributed via a network.

The computer 500 includes a CPU (Central Processing Unit) 511, an interface 512, an output part 513, an input part 514, a main memory part 515 and a sub-memory part 516.

The CPU 511 controls each part by the execution of various programs. The CPU 511 is also a part for executing the program of displaying the state distribution diagram MP. The interface 512 is a part for conducting information input and output with the external equipment. The interface 512 is also a part for connecting the computer 500 to LAN (Local Area Network) or WAN (Wide Area Network). The interface 512 is also a part for inputting the measurement result (data) of the state of the gas introduction hole 12 from the measuring device 200 to be described later.

The output part 513 is a part for outputting the result processed by the computer 500. The output part 513 is also a part for displaying the state distribution diagram MP. The input part 514 is a part for accepting the information from the user. In the input part 514, a keyboard and a mouse are used. Further, the input part 514 includes a function of reading the information recorded in the recording medium MM.

In the main memory part 515, for example, a RAM (Random Access Memory) is used.

A portion of the sub-memory part 516 is used as a portion of the main memory part 515. In the sub-memory part 516, for example, a HDD (Hard disk drive) or a SSD (Solid State Drive) is used. The sub-memory part 516 may be an external memory device connected via a network.

As shown in FIG. 15 (b), in the displaying method of the state distribution diagram MP, first, a processing for importing the measurement result (data) of the state of each of the plurality of gas introduction holes 12 into the computer 50 is performed (step S301). The data is at least the X, Y coordinates and measurement result of the state as shown in FIG. 13 (b). CPU511 performs the determination of good, normal, or poor based on the predetermined conditions from this data, and acquires display correspondence corresponding to the determination result.

Next, a processing of converting to a state distribution diagram MP is performed (step S302). CPU511 performs a processing of converting the state distribution diagram MP into an image data for displaying base on X, Y coordinates of the imported data and the display mode corresponding to each coordinate.

Next, the display of the state distribution diagram MP is performed (step S303). CPU511 performs a processing of displaying the image data converted in the previous step S302 in the output part 513 as an image. Thus, the state distribution diagram MP is displayed in the output part 513.

(Display Example of State Distribution Diagram)

Figure 16:
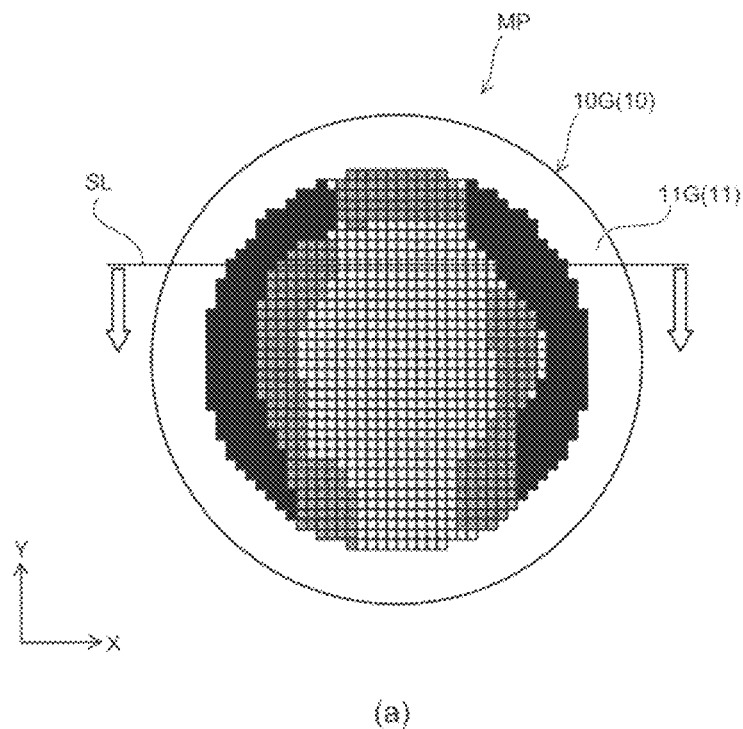
FIGS. 16 (a) and (b) are diagrams showing a display example (part 1) of the state distribution diagram.
Figure 16:
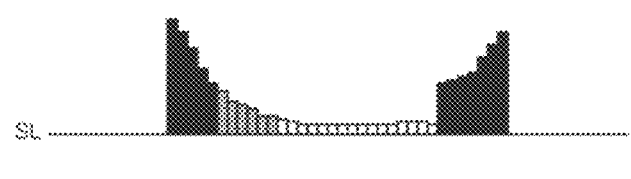

FIGS. 16 (a) and (b) are diagrams showing a display example (part 1) of the state distribution diagram.

In FIG. 16 (a), the state distribution of the gas introduction holes 12 in the plane of the image 10G of the electrode 10 and the image 11G of the substrate 11 is shown in the XY plane. By this state distribution diagram MP, the in-plane distribution of the state of the plurality of gas introduction holes 12 of the electrode 10 (substrate 11) can be grasped visually.

Further, in FIG. 16 (b), the state distribution along the scan line SL of the state distribution diagram MP in FIG. 16 (a) is shown. The user sets the scan line SL to a desired position by operating the input part 514 (mouse etc.), while referring to the state distribution diagram MP shown in FIG. 16 (a) which is displayed in the output part 513 of the computer 500. Thus, the state of the gas introduction hole 12 along the scan line SL is represented as shown in FIG. 16 (b). When the user moves the scan line SL, the state shown in FIG. 6 (b) changes in association accordingly.

In the state display of the gas introduction holes 12 on the scan line SL shown in FIG. 16 (b), along with a color-coding display corresponding to the state of respective gas introduction hole 12, the measurement result is displayed corresponding to the height. The user can also grasp the measurement result by height, through selecting an arbitrary measurement item such as the hole diameter or the inner wall surface roughness.

It should be noted that, the scan lines SL is not limited to the direction along the X axis, and may be a direction along the Y axis, or an oblique direction. Further, the scan line SL is not limited to straight line, but can be arbitrarily set as bent line, curved line or the like.

Figure 17:
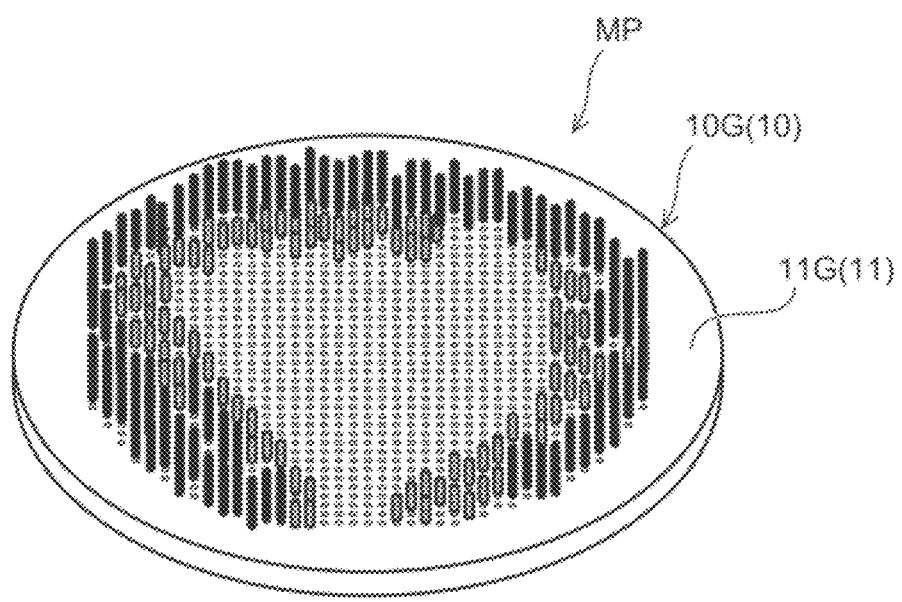
FIG. 17 is a diagram showing a display example (part 2) of the state distribution diagram.

FIG. 17 is a diagram showing a display example (part 2) of the state distribution diagram.

In the state distribution diagram MP shown in FIG. 17, together with displaying the image 10G of the electrode 10 and the image 11G of the substrate 11 three-dimensionally, a display showing the state of the plurality of gas introduction holes 12 is represented by height. Further, in this display, the state of the gas introduction hole 12 is represented by height, and is also displayed in different colors corresponding to the state. By displaying the state distribution diagram MP three-dimensionally, the state of the gas introduction holes 12 as a whole of the electrode 10 becomes easier to be grasped.

Incidentally, the angle of the three-dimensional display of the state distribution diagram MP is possible to be set arbitrarily by the user. For example, the inclination angle and the reference angle can be selected arbitrarily by the operation of the input part 514 (mouse etc.).

Further, in the state distribution diagram MP and the displaying method thereof according to the present embodiment, the state distribution diagram MP may be acquired with the lapse of the time when the electrode 10 is used in the plasma etching device 100. Thereby, the consumption degree of the electrode 10 can be grasped by the state distribution diagram MP arranged in time series.

Further, the difference between each time in the state distribution diagram MP arranged in time series may be acquired so as to be displayed as the state distribution diagram MP. From the state distribution diagram MP showing this difference, the deterioration degree of the gas introduction hole 12 corresponding to the in-plane position of the electrode 10 can be easily grasped.

(State Prediction)

Next, state prediction will be described.

Because in the present measuring method, the state of the gas introduction hole 12 can be quantitatively measured, the replacement time of the electrode 10 is possible to be predicted by performing the measurement regularly.

Figure 18:
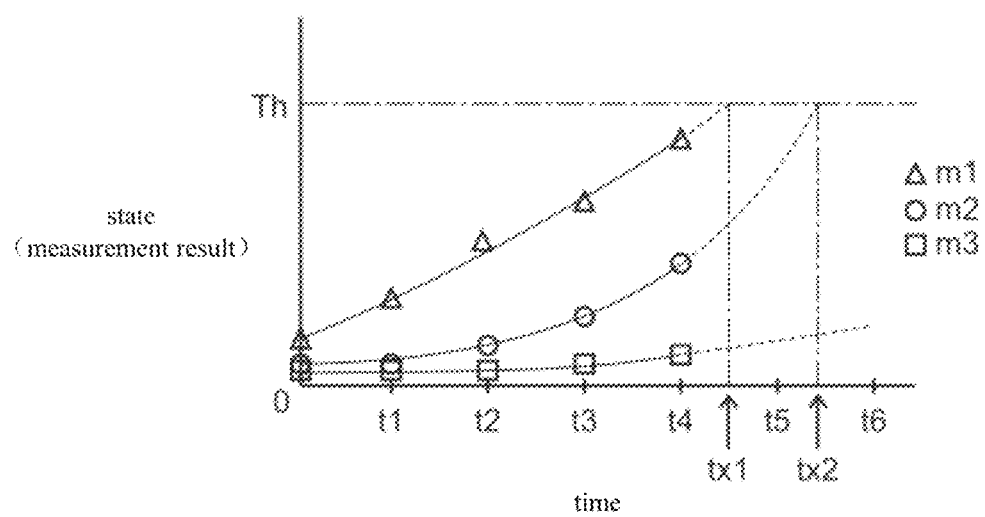
FIG. 18 is a diagram explaining the change and prediction of the state (measurement result).

FIG. 18 is a diagram explaining the change and prediction of the state (measurement result). The horizontal axis of FIG. 18 represents time and the vertical axis represents the state (measurement result).

In FIG. 18, the change-with-time (time t1~t4) of the measurement results m1, m2 and m3 of three gas introduction holes 12 is shown as an example. An approximate curve is acquired from the plot of the time t1~t4 of each of the measurement results m1, m2 and m3. Then, the time for this approximate curve and threshold value Th crossing with each other, is predicted to be the time when the gas introduction hole 12 is poor.

For example, in the measurement result m1, the crossing time of the approximate curve and threshold value Th is tx1. The time tx1 is between the time t4 and the time t5, the state of the gas introduction hole 12 at this time tx1 is predicted to be poor. Further, in the measurement result m2, the crossing time of the approximate curve and threshold value Th is tx2. The time tx2 is between the time t5 and the time t6, the state of the gas introduction hole 12 at this time tx2 is predicted to be poor. In the measurement result m3, the crossing time of the approximate curve and the threshold value Th does not occur until the time t6. Therefore, in this gas introduction hole 12, the state is not predicted to be poor until the time t6. In this way, from the change-with-time of the measurement result of each gas introduction hole 12, the state of respective gas introduction hole 12 can be predicted, and on the basis of this, the replacement time of the electrode 10 can be predicted.

Figure 19:
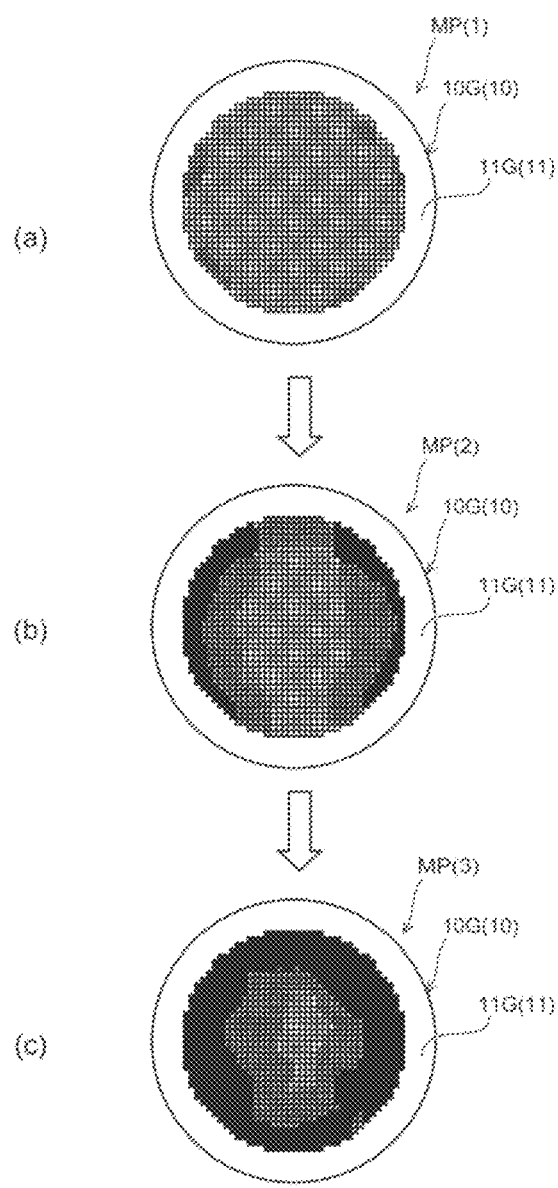
FIGS. 19 (a) to (c) are diagrams showing an example of the prediction distribution diagram.

FIGS. 19 (a) to (c) are diagrams showing examples of the state distribution diagram based on the prediction.

As previously described, when the state of the gas introduction hole 12 is measured regularly to acquire the change-with-time by the present measuring method, the change in the state of the gas introduction hole 12 can be predicted from the measurement result. In FIGS. 19 (a) to (c), examples representing this prediction result as state distribution diagrams MP (1) to MP (3). The prediction time marches in the order of the state distribution diagram MP (1) shown in FIG. 19 (a), the state distribution diagram MP (2) shown in FIG. 19 (b), the state distribution diagram MP (3) shown in FIG. 19 (c). The state or the replacement time of the electrode 10 can be grasped visually by representing the prediction result on the state distribution diagrams MP (1) to MP (3).

As described above, by the electrode and the measuring method of the gas introduction hole according to the present embodiment, the gas introduction hole provided in the electrode for the plasma etching device can be measured with high accuracy, and an electrode having a highly accurate gas introduction hole can be provided.

Further, by the regenerating method of the electrode 10 for the plasma etching device according to the present embodiment, the used electrode 10 can be regenerated. Thereby, the electrode 10 of the same substrate 11 can be used for a long term as compared with the case of time management, and the running cost of the plasma etching device 100 is possible to be reduced.

Further, by the regenerating method of the electrode 10 for the plasma etching device according to the present embodiment, the used electrode 10 can be regenerated. Thereby, the electrode 10 of the same substrate 11 can be used for a long term as compared with the case of time management, and the running cost of the plasma etching device 100 is possible to be reduced.

Further, by the plasma etching device according to the present embodiment, the gas introduction hole provided in the electrode for the plasma etching device can be measured with high accuracy, and an electrode having a highly accurate gas introduction hole can be provided.

Further, by the state distribution diagram MP and the displaying method thereof according to the present embodiment, the state of the gas introduction hole provided in the electrode for the plasma etching device can be easily grasped, and the state or the lifetime of the electrode 10 can be visually determined objectively.

Incidentally, although the present embodiment and the other examples have been described above, the present disclosure should not be construed as being limited to these examples. For example, in the present embodiment, the present measuring method has been applied as the measurement of the gas introduction hole 12. However, the state of the gas introduction hole 12 may be measured by using a measuring method other than the present measuring method. Further, the state distribution diagram MP described in the present embodiment is one example, and the determination or the display mode is not limited thereto. Further, for each embodiment, or other examples described above, adaptation, addition of configuration components, deletion, and design change, even an appropriate combination of the features of each embodiment performed by those skilled in the art, are within the scope of the present disclosure, as long as they include the subject matter of the present disclosure.

EXPLANATION OF REFERENCE SYMBOLS

10 . . . electrode
11 . . . substrate
12 . . . gas introduction hole
100 . . . plasma etching device
110 . . . chamber
120 . . . upper electrode
121 . . . gas introduction hole
130 . . . lower electrode
140 . . . gas introduction passage
141 . . . holding part
150 . . . exhaust passage
160 . . . pump
170 . . . high-frequency applying part
200 . . . measuring device
210 . . . light-emitting part
215 . . . controller
220 . . . light receiving part
225 . . . image processing part
300 . . . measuring device
310 . . . camera
315 . . . image processing part
L1, L2 . . . light
MP, MP (1), MP (2), MP (3) . . . state distribution diagram
SCL . . . translucent screen
W . . . object

What is claimed is:

1. A measuring method of a gas introduction hole provided in an electrode for a plasma etching device, used for measuring the gas introduction hole provided to penetrate a substrate of the electrode for the plasma etching device in a thickness direction, and comprising the steps of:
   a) irradiating light from one surface side of the substrate toward the gas introduction hole;
   b) obtaining a two-dimensional image of the light transmitted to other surface side of the substrate via the gas introduction hole; and
measuring at least one of a diameter, an inner wall surface roughness and a degree of perpendicularity of the gas introduction hole based on the two-dimensional image, wherein, the inner wall surface roughness of the gas introduction hole is measured based on a slope of a signal along a scanning line of the two-dimensional image.

2. The measuring method according to claim 1, wherein, the light is coherent light.

3. The measuring method according to claim 1, further comprising a step of obtaining an opening portion image of the gas introduction hole from one surface side of the substrate,
   wherein, in the step of measuring the gas introduction hole, a measurement is performed based on the two-dimensional image and the opening portion image.

4. A plasma etching device, comprising:
   a chamber;
   an upper electrode provided in the chamber, having a gas introduction hole penetrating in a thickness direction of a substrate;
   a lower electrode opposite to the upper electrode, being provided in the chamber;
   a high-frequency applying part for applying a high-frequency between the upper electrode and the lower electrode in the chamber; and a measuring part for measuring the state of the gas introduction hole, wherein, the measuring part comprises:
- a light-emitting part for irradiating light from one surface side of the substrate toward the gas introduction hole;
- a light receiving part for obtaining a two-dimensional image of the light transmitted to other surface of the substrate via the gas introduction hole; and
- an image processing part for performing a processing of measuring at least one of a diameter, an inner wall surface roughness and a degree of perpendicularity of the gas introduction hole based on the two-dimensional image, wherein, the image processing part measures the inner wall surface roughness of the gas introduction hole based on a slope of a signal along a scanning line of the two-dimensional image.

5. The plasma etching device of claim 4, wherein, the light is coherent light.

6. The plasma etching device of claim 4, further comprising an image obtaining part for obtaining an opening portion image of the gas introduction hole from one surface side of the substrate, wherein, when measuring the gas introduction hole, a measurement is performed based on the two-dimensional image and the opening portion image obtained by the image obtaining part.

7. The plasma etching device of claim 4, wherein, the light-emitting part is provided movably in the holding part for holding the upper electrode.

8. The plasma etching device of claim 4, wherein, the light receiving part is provided movably forward and backward between the upper electrode and the lower electrode.

* * * * *